(12) United States Patent
Kondo et al.

(10) Patent No.: US 6,897,129 B2
(45) Date of Patent: May 24, 2005

(54) FABRICATION METHOD OF SEMICONDUCTOR DEVICE AND SEMICONDUCTOR DEVICE

(75) Inventors: Yasuichi Kondo, Kofu (JP); Wataru Hirasawa, Nirasaki (JP); Nobuyuki Sugii, Tokyo (JP)

(73) Assignees: Renesas Technology Corp., Tokyo (JP); Renesas Eastern Japan Semiconductor, Inc., Tokyo (JP)

( * ) Notice: Subject to any disclaimer, the term of this patent is extended or adjusted under 35 U.S.C. 154(b) by 0 days.

(21) Appl. No.: 10/440,102

(22) Filed: May 19, 2003

(65) Prior Publication Data

US 2003/0221611 A1 Dec. 4, 2003

(30) Foreign Application Priority Data

May 31, 2002  (JP) .................................... 2002-158608

(51) Int. Cl.⁷ ............................................. H01L 21/20
(52) U.S. Cl. ...................................... 438/479; 438/507
(58) Field of Search ................................ 438/479–509

(56) References Cited

U.S. PATENT DOCUMENTS

| | | | |
|---|---|---|---|
| 5,221,413 A | 6/1993 | Brasen et al. ................ | 156/613 |
| 5,659,187 A | 8/1997 | Legoues et al. ............. | 257/190 |
| 2002/0098627 A1 * | 7/2002 | Pomarede et al. ........... | 438/149 |
| 2003/0111013 A1 * | 6/2003 | Oosterlaken et al. ........ | 118/724 |
| 2003/0119288 A1 * | 6/2003 | Yamazaki et al. ........... | 438/565 |
| 2003/0124818 A1 * | 7/2003 | Luo et al. ................... | 438/482 |
| 2003/0203554 A1 * | 10/2003 | Kubo et al. ................. | 438/200 |
| 2003/0227057 A1 * | 12/2003 | Locchtefeld et al. | |

FOREIGN PATENT DOCUMENTS

| | | |
|---|---|---|
| EP | 0 636 705 | 2/1995 |
| JP | 6-69131 | 3/1994 |
| JP | 2002-118254 | 4/2002 |
| JP | 2002-329664 | 11/2002 |
| WO | WO 98/59365 | 12/1998 |

* cited by examiner

*Primary Examiner*—Savitri Mulpuri
(74) *Attorney, Agent, or Firm*—Miles & Stockbridge P.C.

(57) ABSTRACT

Gases for film formation are introduced from a plurality of holes provided at a gas nozzle into a processing chamber of a batch-type CVD film-forming apparatus to cause a turbulence of the gases within the processing chamber. In the state where the chamber is kept at a pressure within an atmospheric and quasi-atmospheric pressure region, a silicon-germanium film is epitaxially grown on a semiconductor wafer placed within the processing chamber. Subsequently, a strained silicon film is epitaxially grown on the silicon-germanium film. Thereafter, a semiconductor element is formed in the semiconductor wafer on which the silicon-germanium film and the strained silicon film have been formed, respectively.

7 Claims, 14 Drawing Sheets

FABRICATION METHOD OF SEMICONDUCTOR DEVICE AND SEMICONDUCTOR DEVICE

BACKGROUND OF THE INVENTION

This invention relates to a fabrication technique of a semiconductor device and a technique for semiconductor device, and more particularly, to a fabrication method of a semiconductor device wherein a silicon germanium film is formed on a semiconductor substrate and also to a technique effective in application to semiconductor devices.

In Japanese Patent Application Laid-open No. Hei 6(1994)-69131 of Ashikaga et al., a low pressure CVD method and an atmospheric pressure CVD method for the formation of an SiGe film are considered, and a novel SiGe film-forming method of overcoming the drawbacks of the former methods is proposed.

SUMMARY OF THE INVENTION

In recent years, speeding up of semiconductor device is in progress, and for one of approaches therefor, it has been adopted to use a silicon-germanium (SiGe) thin film. For instance, a silicon-germanium film and a silicon film are successively, epitaxially formed on a silicon substrate wherein a semiconductor element, such as a MOS transistor, is formed to provide a semiconductor device.

For the method of forming a silicon-germanium film, it occurs to one to use a film-forming method such as an MBE (molecular beam epitaxy) method or a UHV-CVD (ultrahigh vacuum chemical vapor deposition) method.

With these film-forming methods, however, a silicon-germanium film is formed in high vacuum, so that the film-forming apparatus should be provided with an advanced type of vacuum pumping system. This requires a large-sized film-forming apparatus, thus increasing the fabrication costs of semiconductor device. In addition, with the case of the film formation under high vacuum, the forming speed of silicon-germanium film is relatively small. Accordingly, a long time is required for the formation of the silicon-germanium film, thereby increasing the fabrication time of semiconductor device.

For the forming method of a silicon-germanium film, it may occur that a single wafer CVD method using a laminar flow under atmospheric pressure is used. In this case, although the forming speed of a silicon-germanium film can be made relatively large, a problem on practical application arises in that the productivity of semiconductor device is worsened when a thick film is formed since the condition of single wafer processing is added. When using this type of CVD apparatus, gases introduced into a processing chamber of the forming apparatus run in the processing chamber as a laminar flow, under which the quality of the silicon-germanium film formed on a semiconductor substrate is unlikely to be improved. This results in the lowering in fabrication yield of the semiconductor device.

Where crystal defects are found to be large in number in the silicon-germanium film epitaxially grown on a silicon substrate or where surface roughness is great, the resulting semiconductor device becomes low in reliability, with the possibility that the fabrication yield of semiconductor device lowers.

An object of the invention is to provide a fabrication method of a semiconductor device wherein a fabrication time can be shortened, and also such a semiconductor device as mentioned above.

Another object of the invention is to provide a fabrication method of a semiconductor device wherein a fabrication yield can be improved, and also the thus fabricated semiconductor device.

A further object of the invention is to provide a fabrication method of a semiconductor device wherein reliability can be improved, and also the thus fabricated semiconductor device.

The above and other objects and novel features of the invention will become apparent from the following description with reference to the accompanying drawings.

Typical embodiments of the invention among those embodiments disclosed in this application are briefly described below.

A fabrication method of a semiconductor device according to the invention comprises forming a silicon-germanium film under a pressure within an atmospheric or quasi-atmospheric region by use of a batch-type film-forming apparatus.

Further, a fabrication method of a semiconductor device according to the invention comprises introducing gases into a processing chamber of a film-forming apparatus so that turbulence is established, under which a silicon-germanium film is formed.

A semiconductor device according to the invention includes a silicon-germanium film formed on a semiconductor substrate wherein a distribution of germanium concentration along the thickness of the film has a peak at an intermediate region of the silicon-germanium film.

DETAILED DESCRIPTION OF THE PREFERRED EMBODIMENTS

Figure 1:
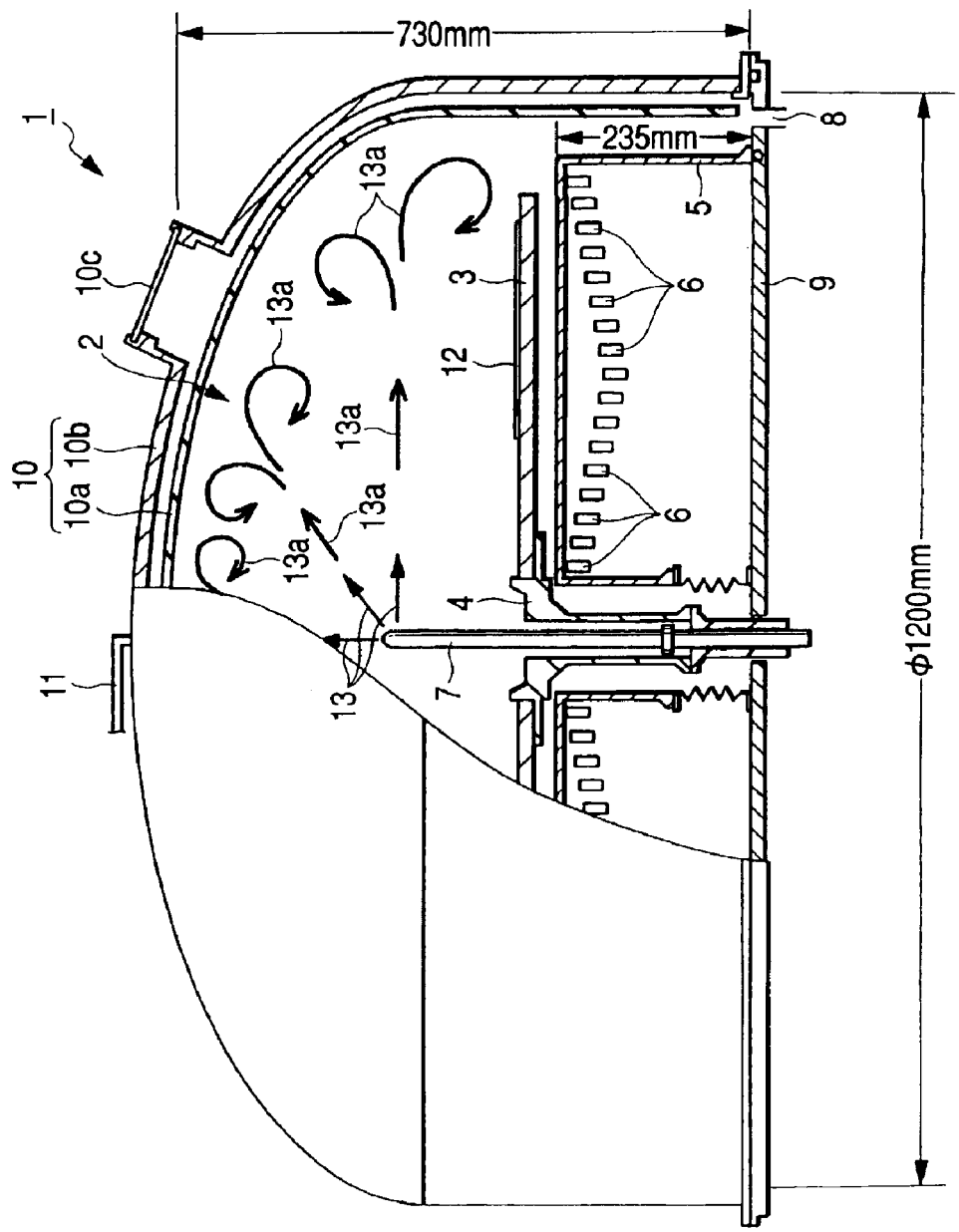
FIG. 1 is a front view showing, partly cut away, a conceptional structure of a semiconductor fabricating apparatus used in a fabrication process of a semiconductor device according to one embodiment of the invention.

Prior to detailed description of the invention, several terms used herein are explained below.

1. The term "gas turbulence" means the state wherein a swirl is generated in a flow of gases and suffers an irregular change. In the gas turbulence, a swirl is not kept uniformly but is changed or fluctuated irregularly with respect to the position, direction, shape and/or size thereof.
2. The term "atmospheric and quasi-atmospheric pressure regions" means a combination of an atmospheric pressure region and a quasi-atmospheric pressure region. The atmospheric pressure region covers a pressure ranging from about 88,000 to 115,000 Pa (660 to 860 Torr). The quasi-atmospheric pressure region consists of a quasi-atmospheric low pressure region ranging from about 20,000 to 88,000 Pa (150 to 660 Torr) and a quasi atmospheric high pressure region ranging from about 115,000 to 180,000 Pa (860 to 1,350 Torr). Accordingly, the atmospheric and quasi-atmospheric pressure regions correspond to a pressure of from about 20,000 to 180,000 Pa (150 to 1350 Torr or 0.2 to 1.8 atm.).
3. The term "amorphous film" used herein means those films including a film in an amorphous state where atoms are arranged disorderly, a polycrystal film wherein crystal grains having different types of crystal orientations aggregate through grain boundaries, and a microcrystalline film having a microcrystalline structure between amorphous and polycrystalline states.
4. When mention is made of a substance such as silicon germanium, such a substance (such as an element, a group of atoms, a molecule, a compound or the like) means not only an indicated substance per se, but also those substances containing the indicated substance as a major component or compositional component unless otherwise indicated. Accordingly, with respect to gaseous components and the like, these components include, aside from the indicated components, various types of additive or composite components such as an added gas, a carrier gas, a diluting gas, an auxiliary gas added for the purpose of obtaining secondary effects and the like.
5. The term "semiconductor device" used herein means those devices including the devices formed not only on a single crystal silicon substrate, but also on other types of substrates such as a SOI (silicon on insulator) substrate, a SOS (silicon on sapphire) substrate, a substrate for making a TFT (thin film transistor) liquid crystal device and the like unless otherwise specified.
6. The term "semiconductor substrate" means single crystal substrates (i.e. semiconductor wafers substantially in the form of a disk) made of silicon and other types of semiconductor and used for fabricating semiconductor integrated circuits, a sapphire substrate, a glass substrate, other types of insulating, anti-insulating and semiconductor substrates, and composite substrates thereof.

Although embodiments of the invention are illustrated by division into a plurality of sections or embodiments if expediently necessary, these are not mutually irrelevant to one another unless otherwise stated. More particularly, one may be in relation with a modification, details, supplemental explanation and the like of part or all of others.

In the following embodiments, where reference is made to the parameters of elements (including the number, numerical value, quantity, range and the like), they should not be construed as limiting to specified values or numbers, respectively, except the case where they are specified or limited to a specific value apparently in principle.

Moreover, it is as a matter of course that constituent elements (including steps) in the following embodiments are not always essential except the case where otherwise specified or where such elements are considered to be apparently essential in principle.

Likewise, if reference is made to the shape, positional relation and the like of the constituent elements, then substantially like or similar shapes and the like are also within the scope of the invention except the case where otherwise specified or where such shapes should not be apparently included in principle. This is true of the above-indicated numbers and ranges.

Throughout the drawings for illustrating the embodiments of the invention, like reference numerals indicate like parts or members having the same function, which are not repeatedly explained after once having been illustrated.

In the drawings used for illustrating the embodiments of the invention, hatching may be made even on a front view for ease in reviewing the drawings.

The embodiments of the invention are described in detail with reference to the accompanying drawings.

(Embodiment 1)

Figure 2:
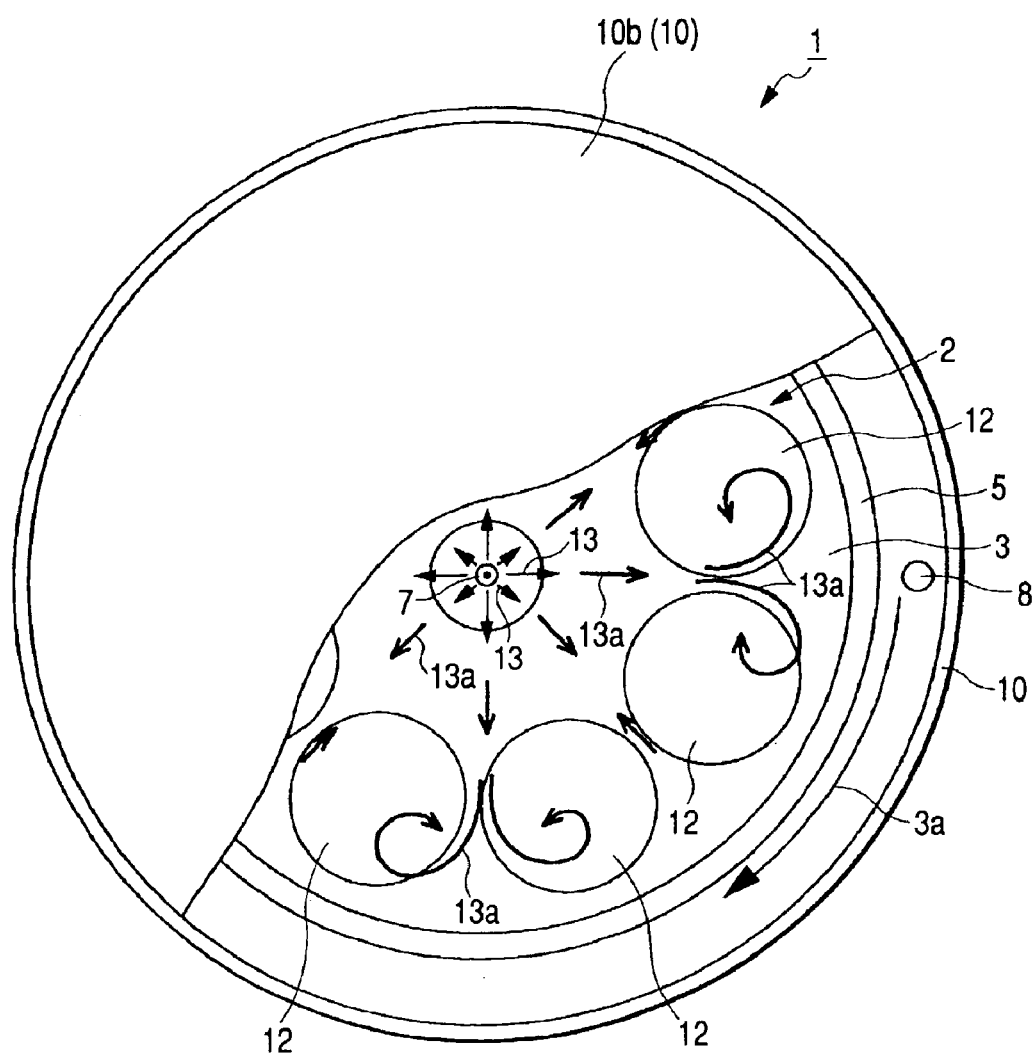
FIG. 2 is a top view, partly cut away, of the semiconductor fabricating apparatus of FIG. 1.

FIG. 1 is a front view, partially cut away, of a conceptional structure of a semiconductor fabricating apparatus used in the process of fabricating a semiconductor device according to this embodiment of the invention. FIG. 2 is a top view, partly cut away, of the semiconductor fabricating apparatus of FIG. 1. It will be noted that in FIG. 1, the cut away portion is shown as a conceptional section.

A semiconductor fabricating apparatus 1 shown in FIGS. 1 and 2 is a film-forming apparatus which is used in the process of forming a silicon-germanium film and a silicon film on a semiconductor substrate and is, for example, a batch-type CVD apparatus. It will be noted that for ease of understanding, structures other than a processing chamber and the inside thereof of the semiconductor fabricating device 1 are not particularly shown, with their detailed description being omitted.

The semiconductor fabricating apparatus 1 includes a reaction chamber or processing chamber 2, a susceptor 3 arranged therein, a susceptor support 4 for supporting the susceptor 3, a high frequency coil 6 located below the susceptor 3 and accommodated within a coil cover 5, a gas nozzle 7 for introducing various types of gases into the processing chamber 2, and a gas exhaust port 8 for discharging a gas from the processing chamber 2.

The processing chamber 2 is a hermetically sealable reaction chamber and has a base plate 9, a bell jar 10 airtightly connected to the base plate 9 via an O ring, and a bell jar purge portion 11. The bell jar 10 is constituted of a quartz bell jar 10a provided at the inner wall side thereof and a stainless steel bell jar 10b provided at an outer wall (outer) side thereof, and the stainless steel bell jar 10b has a viewport 10c through which the inside of the processing chamber 2 can be visually observed.

The susceptor 3 is supported with the susceptor support 4 within the processing chamber 2 that is a space surrounded with the base plate 9 and the bell jar 10, and is so arranged as to be rotatable along a susceptor rotation direction 3a within the processing chamber 2. The susceptor 3 is made, for example, of carbon with its surface being coated, for example, with silicon carbide (SiC). The susceptor 3 is so arranged that a plurality of semiconductor wafers (semiconductor substrates) 12 can be disposed thereon.

The high frequency coil 6 accommodated in the coil cover 5 is so arranged as to be connected to a high frequency power supply not shown, which is provided outside the processing chamber 2, thereby enabling a high frequency voltage or high frequency power to be applied or supplied to the high frequency coil 6 from the high frequency power supply. When high frequency power is supplied to the high frequency coil 6, an induction current generates in the susceptor whose inside is made of carbon or the like, and the temperature of the susceptor can be raised, for example, to about 1200° C. This permits the semiconductor wafer 12 disposed on the susceptor 3 to be heated (by RF heating system) to a desired temperature.

The gas nozzle 7 is connected to a gas introducing means, not shown, so that desired types of gases can be introduced into the processing chamber 2 at desired flow rates from the gas nozzle 7. The gas exhaust port 8 is connected to a gas exhaust pipe, not shown, and is thus so arranged that the gases introduced from the gas nozzle 7 into the processing chamber 2 can be discharged. Although only one gas exhaust port 8 is shown in FIG. 2, another gas exhaust port 8 is also provided at a symmetric position relative to the gas exhaust port 8 shown in the figure. The number of gas exhaust ports 8 may be increased or decreased as required.

In this embodiment, the gas nozzle is disposed as projecting upwardly substantially from the center of the susceptor 3 and thus, permits gases to be introduced into the processing chamber 2 from above a plurality of semiconductor wafers 12 placed on the susceptor 3.

Figure 3:
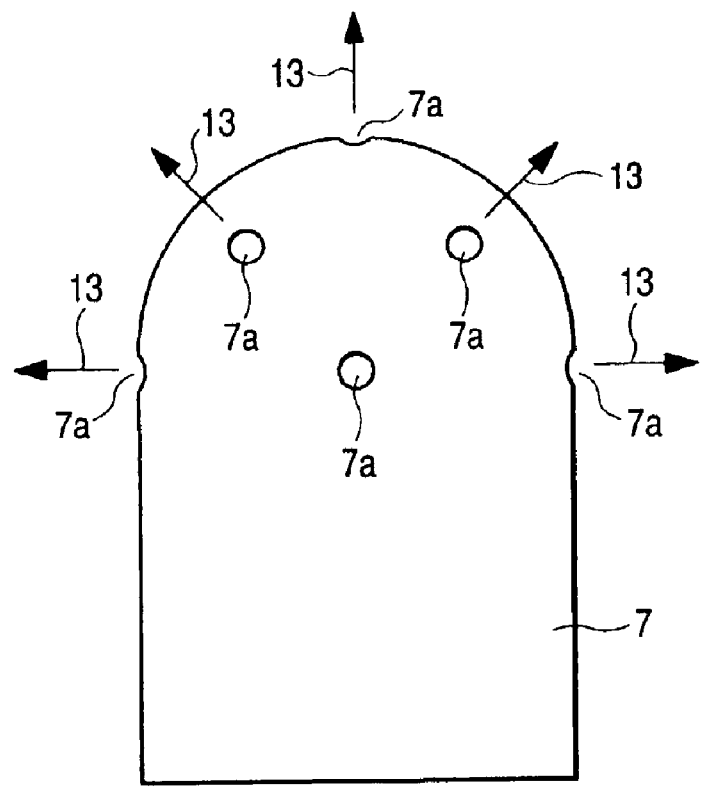
FIG. 3 is a side view conceptionally showing a structure in the vicinity of a gas nozzle tip of the semiconductor fabricating apparatus of FIG. 1.
Figure 4:
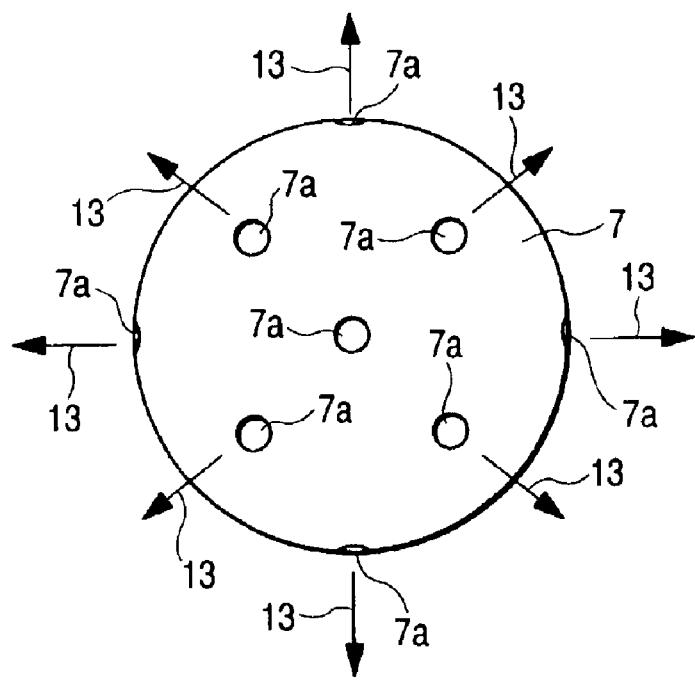
FIG. 4 is a top view of the gas nozzle of FIG. 3.

FIG. 3 is a side view conceptionally showing a structure in the vicinity of the tip of the gas nozzle 7, and FIG. 4 is a top view thereof. The gas nozzle 7 is formed with a plurality of holes 7a in the vicinity of the round tip thereof, and desired types of gases are charged or introduced into the processing chamber 2 from individual holes 7a. Each hole 7a has, for example, a diameter of 4 mm and, for example, nine holes 7a are formed at different positions of the curved face at the tip of the gas nozzle 7. In this way, the holes 7a face in different directions, so that gases are charged via the holes 7a of the gas nozzle 7 in plural directions from the inside of the processing chamber 2 toward the inner walls of the processing chamber 2. The gas nozzle may be so arranged as to be rotated within the processing chamber.

The gas flow introduced or radiated from the holes 7a of the gas nozzle 7 into the processing chamber 2 has different directions in the processing chamber 2. For instance, a gas is charged, as is particularly shown as gas charge directions 13 in FIGS. 1 to 4, in a horizontal direction (i.e. a direction parallel to the susceptor 3, or a direction parallel to the main surface of the semiconductor wafer 12), in an upper or vertical direction (i.e. a direction vertical to the susceptor 3, or a direction vertical to the main surface of the semiconductor wafer 12) and in arbitrary directions intermediate between the horizontal and vertical directions. Upon the charge or jetting of a gas from the gas nozzle, the velocity of the gas flow from the holes 7a of the gas nozzle 7 is, for example, at 25 m/seconds. The pressure (gas feed pressure) of the gas charged from the gas nozzle 7 is, for example, at about 200,000 Pa (i.e. about 2 kgf/cm$^2$), and thus the gas flow is, for example, at 170 slm (standard liters per minute). The gas radiated from the holes 7a of the gas nozzle 7 collides with the inner walls and the like of the processing chamber 2. This does not allow the gas introduced into the processing chamber to be in a laminar flow, but causes a turbulence eddy flow. Although average flows or typical gas flows 13a in the processing chamber 2 are schematically shown by arrows in FIGS. 1 and 2, a swirl (eddy current) is generated in the gas flow within the processing chamber 2 owing to the turbulence eddy flow. This swirl irregularly changes. The gas flow, in which the turbulence eddy flow is caused and eddy currents are generated in the flow above the semiconductor wafer 12, is forcedly circulated within the processing chamber 2. The swirl of the gas flow in the processing chamber is not kept constant but irregularly changes. This causes the gas in the processing chamber 2 to be homogenized. In this way, the gas components can be uniformly or homogenizedly stayed over a plurality of semiconductor wafers 12 placed on the susceptor 3. Thus, the quality and thickness of the silicon-germanium film or silicon film formed on the semiconductor wafers 12 by a CVD method or the like can be made uniform between the semiconductor wafers 12 and in plane of individual semiconductor wafers 12. The gases which do not contribute to reaction are discharged from the gas exhaust port 8 to outside of the processing chamber 2. It will be noted that with the case of this embodiment, although gases are charged from the gas nozzle 7 in plural directions, release only in one direction, e.g. in an upper or vertical direction, may be possible.

Next, the fabrication process of the semiconductor device of this embodiment, e.g. MISFET (metal insulator semiconductor field effect transistor), is described with reference to the accompanying drawings. FIGS. 5 to 9 are, respectively, a sectional view of an essential part in the course of the fabrication of the semiconductor device according to the embodiment.

Initially, a plurality of semiconductor wafers (semiconductor substrates) 12 made, for example, of a silicon substrate are provided. For the semiconductor wafer 12, there may be used, for example, a substrate made of silicon single crystal by 4 degrees off from (100), i.e. a single crystal silicon substrate (silicon wafer) having a main surface inclined by 4 degrees from the plane (100).

Next, the semiconductor wafers 12 are transferred to the semiconductor fabricating apparatus 1 wherein the wafers 12 are placed in position on the susceptor 3. High frequency power from a high frequency power supply is applied or supplied to the high frequency coil 6 of the semiconductor fabricating apparatus 1. Consequently, the susceptor is heated by application of an induction current thereby heating the semiconductor wafers 12 to a predetermined temperature. Gases for film formation are introduced from the gas nozzle 7 into the processing chamber 2. More particularly, a hydrogen gas (H$_2$) used, for example, as a carrier gas, a monosilane (SiH$_4$) gas used, for example, as a silicon source gas, a diborane gas (B$_2$H$_6$) gas used, for example as a p-type doping gas and diluted with H$_2$ to a concentration of 30 ppm, and a monogermane (GeH$_4$) gas used, for example, as a germanium source gas and diluted with H$_2$ to a concentration of 1% are, respectively, introduced into the processing chamber 2. The gases introduced into the processing chamber 2 react with each other and deposit on the semiconductor wafer 12, thereby causing a silicon-germanium film (SiGe film) to be epitaxially grown on the respective semiconductor wafers 12. The processing chamber 2 should preferably be kept at a pressure within atmospheric pressure and quasi-atmospheric pressure regions and more preferably at a pressure within an atmospheric pressure region. More particularly, the pressure within the processing chamber 2 in the course of the film-forming step of a silicon-germanium film should preferably be within a range of from 20,000 to 180,000 Pa (150 to 1,350 Torr.) more preferably from 60,000 to 140,000 Pa (450 to 1050 Torr.) and more preferably from 88,000 to 115,000 Pa (660 to 860 Torr.). In this manner, hydrogen (H$_2$) gas, monosilane (SiH$_4$) gas, diborane (B$_2$H$_6$) gas and monogermane (GeH$_4$) gas which are discharged from the gas nozzle 7 into the processing chamber 2 can generate turbulence within the processing chamber 2. This enables the resulting silicon-germanium film 21 to be uniform with respect to the quality and thickness thereof.

As set out hereinabove, the pressure within the processing chamber 2 in this embodiment is set at a level higher than those in an MBE apparatus (wherein the pressure within a processing chamber upon forming of a film is within a ultra-high vacuum region of $10^{-4}$ to $10^{-3}$), a UHV-CVD apparatus (wherein the pressure within a processing chamber upon forming of a film is within a high vacuum region of about 0.1 Pa), and a low pressure CVD apparatus (wherein the pressure within a processing chamber upon forming of a film is within a low pressure range of about 10 to 1,000 Pa). Accordingly, the growth rate or film-forming rate of the silicon-germanium film can be made higher than those attained by using the MBE apparatus, UHV-CVD apparatus and low pressure CVD apparatus. If the pressure in the processing chamber 2 is within a range of the atmospheric and quasi-atmospheric pressure regions and is smaller than a pressure of outside air, the base plate 9 and the bell jar 10 can be more strongly combined through the O ring.

It will be noted that a usable silicon source gas includes not only monosilane (SiH$_4$) gas, but also disilane (Si$_2$H$_6$) gas, for example. For the silicon source gas, there may be used a Cl-containing gas such as dichlorosilane (SiH$_2$Cl$_2$) gas, trichlorosilane (SiHCl$_3$) gas, silicon tetrachloride (SiCl$_4$) gas or the like. In addition, HCl gas may be added to those gases mentioned above. This contributes to improving the growth rate of the silicon-germanium film 21 or improving the quality such as by reduction in amount of foreign matters. For the germanium source gas, germanium tetrachloride (GeCl$_4$) or Ge$_2$H$_6$ gas may be used in place of GeH$_4$ gas. Although Be$_2$H$_6$ gas has been mentioned for use as a P-type doping gas to provide a P-type silicon-germanium film 21, an N-type doping gas such as phosphine (PH$_3$) gas may be used in place of the P-type doping gas. In this case, an N-type silicon-germanium film can be formed on the semiconductor wafers 12.

Thereafter, the introduction of the monogermane gas into the processing chamber is stopped, after which gases including hydrogen gas (H$_2$) serving as a carrier gas, monosilane (SiH$_4$) gas serving as a silicon source gas, and B$_2$H$_6$ gas serving as a P-type doping gas are introduced from the gas nozzle 7 into the processing chamber 2. As a result, the growth of the silicon-germanium film 21 is completed and a silicon film (strained silicon film) 22 is epitaxially grown on the silicon-germanium film 21. Under these circumstances, the silicon film 22 having a lattice constant greater than the lattice constant of ordinary silicon crystals, i.e. a so-called strained silicon film 22, is formed on the silicon-germanium film 22 owing to the difference in lattice constant between silicon germanium and silicon. Upon comparison with an ordinary silicon film, the strained silicon film is improved (or increased) with respect to the mobility of electron. Accordingly, with MISFET formed on the strained silicon film 22, the mobility of electrons moving between source and drain is improved, thereby ensuring the high speed of the resulting semiconductor device as will be described hereinafter.

Figure 5:
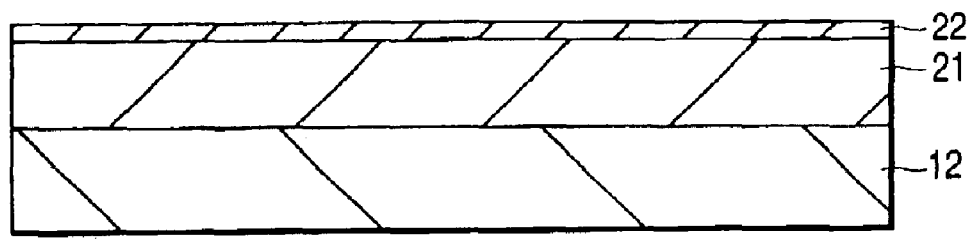
FIG. 5 is a sectional view of an essential part in the course of the fabrication of the semiconductor device according to the embodiment of the invention.

In this way, the silicon-germanium film 21 and the strained silicon film 22 are epitaxially grown on the respective semiconductor wafers 12, thereby providing a structure of FIG. 5.

After removal of the semiconductor wafers 12 from the semiconductor fabricating apparatus 1, a semiconductor element is formed in the respective semiconductor wafers. Although a procedure of forming a semiconductor element in one semiconductor wafer 12 is illustrated herein, a semiconductor element can be formed in a similar way with respect to other semiconductor wafers.

Figure 6:
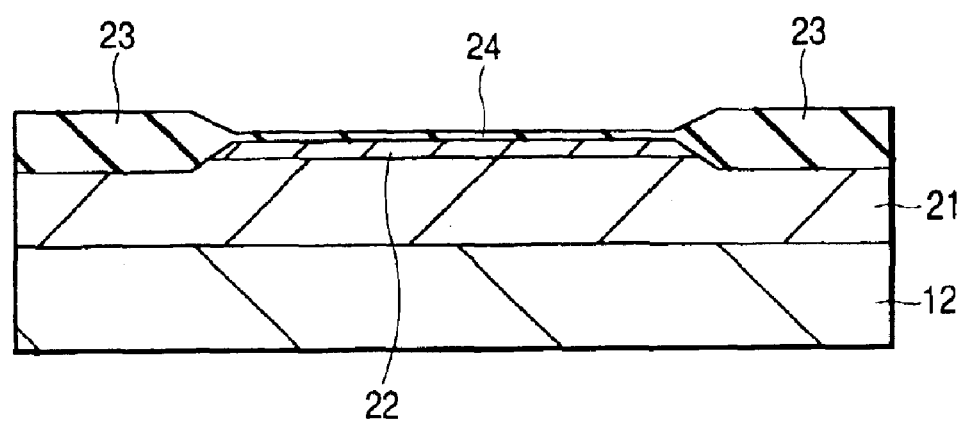
FIG. 6 is a sectional view of the essential part in the course of the fabrication of the semiconductor device subsequent to FIG. 5.

Although not shown in FIG. 6, an impurity may be ion implanted into the main surface of the semiconductor wafer 12 so as to form a well region, if necessary. For instance, if an impurity such as, for example, boron (B) or the like is ion implanted, a P-type well region can be formed. Likewise, an impurity such as phosphorus (P) or the like is ion implanted, an N-type well region can be formed. When using a photoresist as a mask, such an impurity can be implanted only into a desired region.

Next, as shown in FIG. 6, an element isolation region 23, made of silicon oxide or the like, is formed in the main surface of the semiconductor wafer 21 (i.e. a so-called SiGe epitaxial wafer) wherein the silicon-germanium film 21 and the strained silicon film 22 have been formed, respectively. The element isolation region 23 can be formed, for example, by a LOCOS (local oxidation of silicon) method. Alternatively, the element isolation region may be formed by burying a silicon oxide film in a groove formed in the main surface of the semiconductor wafer 12, for example by a STI (shallow trench isolation) method.

Thereafter, a gate insulating film 24 is formed on the surface of the semiconductor wafer 12 (i.e. the surface of the strained silicon film 22). The gate insulating film 24 is made, for example, of a thin silicon oxide film and can be formed by thermal oxidation of the semiconductor wafer 12.

Figure 7:
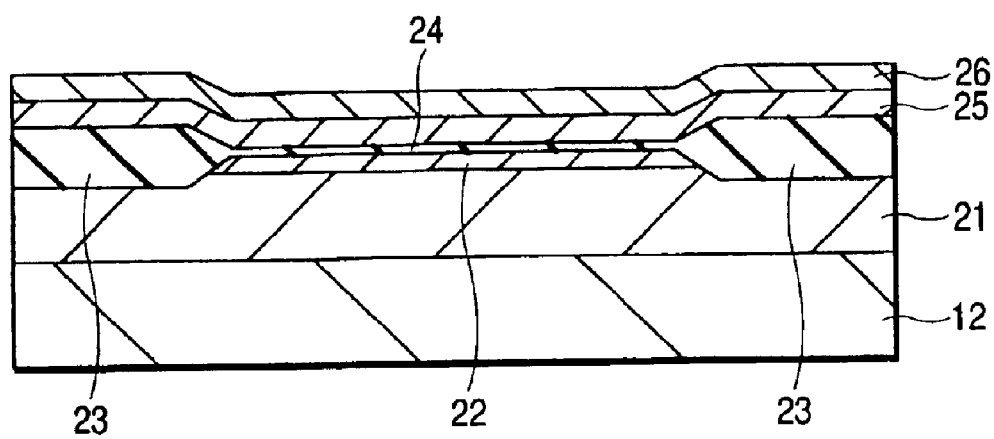
FIG. 7 is a sectional view of the essential part in the course of the fabrication of the semiconductor device subsequent to FIG. 6.

Next, as shown in FIG. 7, a silicon-germanium film 25 is formed on the semiconductor wafer 12. The silicon-germanium film 25 can be formed by use of the semiconductor fabricating apparatus 1 substantially in the same manner as the silicon-germanium film 21. The underlying gate insulating film 24 is made of a silicon oxide film, and the silicon-germanium film 25 formed on the gate insulating film 24 is made of a polycrystalline silicon-germanium film. Alternatively, using the semiconductor fabricating apparatus 1, the silicon-germanium film 25, which is made of an microcrystalline silicon-germanium film or an amorphous silicon-germanium film, may be formed. More particularly, the silicon-germanium film may be constituted of a microcrystalline silicon-germanium film. In the step of forming the silicon-germanium film 25, such gases as used in the step of forming the silicon-germanium film 21 may be employed. In this embodiment, phosphorus is doped in the silicon-germanium film 25.

Figure 8:
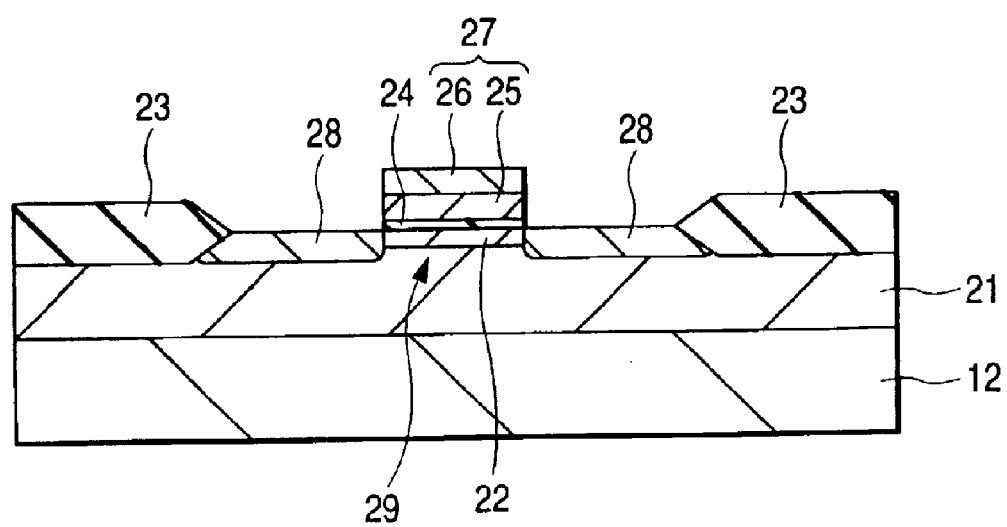
FIG. 8 is a sectional view of the essential part in the course of the fabrication of the semiconductor device subsequent to FIG. 7.

Next, a tungsten silicide (WSi$_2$) film 26 is formed on the silicon-germanium film 25. As shown in FIG. 8, the silicon-germanium film 25 and the tungsten silicide film 26 are, respectively, subjected to patterning as shown in FIG. 8, thereby forming a gate electrode 27 made of the silicon-germanium film 25 and the tungsten silicide film 26. Instead of WSi$_2$, TiSi$_2$ or CoSi$_2$ may be used.

Next, an impurity such as, for example, phosphorus (p), is ion implanted into the a region at opposite sides of the gate electrode 27, thereby forming n-type semiconductor regions (source, drain) 28.

In this way, an n-channel MISFET 29 is formed. The channel region of the MISFET 29 is formed inside the strained silicon film 22, so that the mobility of the electrons moving between the source and drain (n-type semiconductor regions 28) of the MISFET 29 is improved, thereby ensuring the high speed operations of the MISFET 29.

Figure 9:
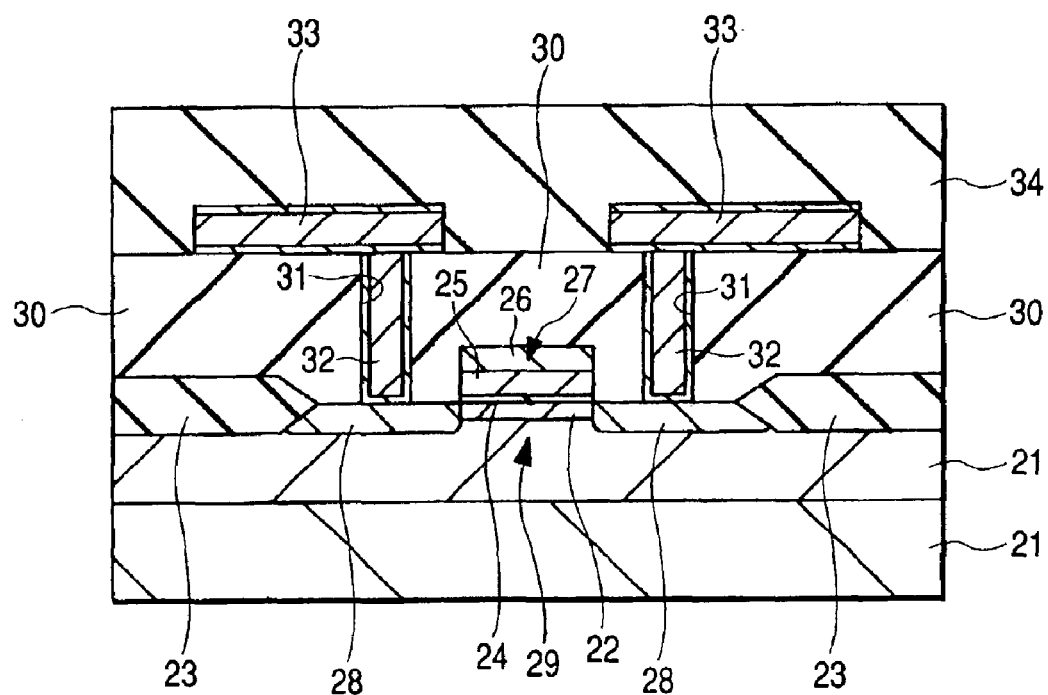
FIG. 9 is a sectional view of the essential part in the course of the fabrication of the semiconductor device subsequent to FIG. 8.

Next, as shown in FIG. 9, an interlayer insulating film 30 is formed over the main surface of the semiconductor wafer 12. The interlayer insulating film 30 can be formed, for example, by depositing a silicon oxide film by a CVD method. Thereafter, a photoresist pattern, not shown, formed on the interlayer insulating film 30 is provided as a mask for dry etching the interlayer insulating film 30 to form a through-hole or contact hole 31 over the n-type semiconductor regions 28 and the gate electrode 27. Subsequently, a plug 32 burying the contact hole 31 is formed, for example, of a titanium nitride film and a tungsten film.

Next, a barrier film or an aluminium alloy film is deposited on the interlayer insulating film 30 and is patterned by use of a photolithographic technique and an etching technique to form a wiring (first wiring layer) 33. An interlayer insulating 34 is formed on the interlayer insulating film 30 so as to cover the wiring 33 therewith.

Thereafter, although not particularly shown in the drawings and not described in detail, a via hole or through-hole is formed in the interlayer insulating film 34 so that part of the wiring 33 is exposed, and a plug burying the through-hole and an upper wiring layer electrically connected to the wiring 33 via the plug are, respectively, formed like the plug 32 and the wiring 33, followed by dicing into semiconductor device chips, thereby fabricating the semiconductor devices according to this embodiment. It will be noted that the number of wiring layers may be appropriately changed depending on the design.

According to this embodiment, since the silicon-germanium film 21 and the silicon-germanium film 25 are, respectively, formed at a pressure within the atmospheric and quasi-atmospheric pressure regions, the growth rate can be increased. When using the batch-type semiconductor fabricating apparatus 1, the silicon-germanium film 21 and the silicon-germanium film 25 can be, respectively, formed on a plurality of semiconductor wafers 12 at the same time. This leads to the shortage in fabricating time of the semiconductor device. The fabrication costs of the semiconductor device can also be reduced.

Turbulence is generated in the processing chamber of the semiconductor fabricating apparatus 1 so that the gases in the processing chamber 2 are forcedly circulated, under which the silicon-germanium film 21 and the silicon-germanium film 25 are, respectively, formed. Accordingly, the silicon-germanium film 21 and the silicon-germanium film 25 can be formed as being in wafer-to-wafer uniformity with respect to the quality and thickness of the films. In addition, the quality and thickness of the silicon-germanium film 21 and the silicon-germanium film 25 in the inplane thereof can be made uniform. This results in improved reliability of the semiconductor device. The fabrication yield of the semiconductor device can be improved.

Where the pressure within the processing chamber is not set at a level lower than a pressure of outside air, it is not necessary to connect the gas exhaust port 8 to a vacuum pump or the like. Thus, any vacuum pumping system does not become necessary for the semiconductor fabricating apparatus 1. The fabrication costs of the semiconductor device can be reduced.

In case where the pressure in the processing chamber 2, which is within the range of the atmospheric and quasi-atmospheric pressure regions, is set at a level lower than a pressure of outside air, this pressure in the processing pressure is higher than that in a MBE apparatus, a UHV-CVD apparatus or a low pressure CVD apparatus. Accordingly, a pumping system having such a great throughput as used in the MBE apparatus, UHV-CVD apparatus or low pressure CVD apparatus is not necessary.

In case where the pressure in the processing chamber 2, which is within a range of the atmospheric or quasi-atmospheric pressure regions, is set at a level higher than a pressure of outside air, a system balancing the introduction of a gas into the processing chamber 2 with the exhaustion of a gas from the processing chamber should favorably be disposed at the exhaustion side.

In this embodiment, the instance of the n-channel MISFET has been illustrated hereinabove. With p-channel MISFET, a polycrystalline silicon-germanium film 25 doped with boron (B) used in place of phosphorus (P) is used as part of the gate electrode 27. The boron-doped polycrystalline silicon-germanium film 25 is improved in boron activity over a boron-doped polycrystalline silicon film. The use of the boron-doped polycrystalline silicon-germanium film 25 as the gate electrode 27 contributes to suppressing depletion at the interface between the gate electrode 27 and the gate insulating film 24. Similar results are obtained when using other types of impurities, e.g. in case where phosphorus (P) is doped in the silicon-germanium film 25 as set out hereinbefore. In addition, similar results are obtained in case where the silicon-germanium film 25 is made of a microcrystalline or amorphous silicon-germanium film doped with boron.

(Embodiment 2)

Figure 10:
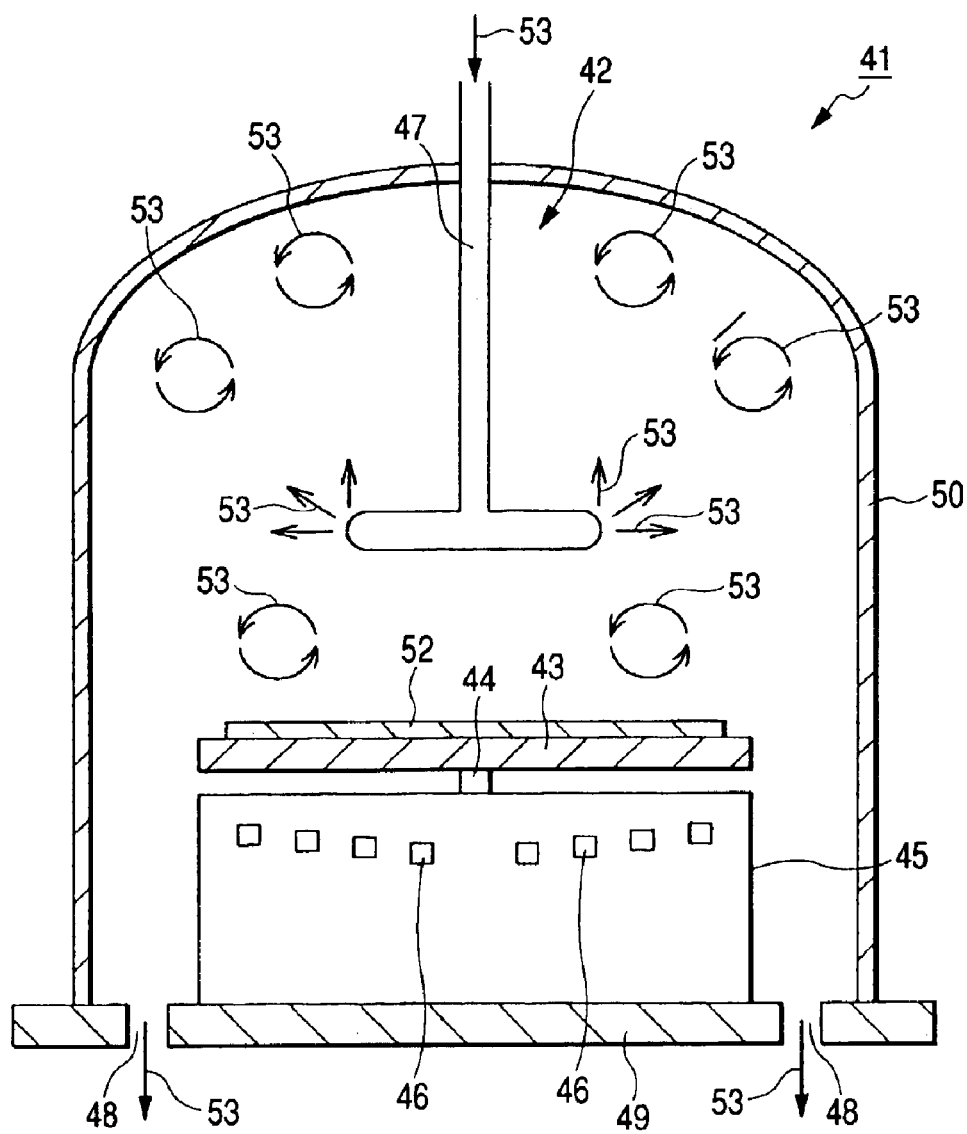
FIG. 10 is an illustrative view showing a semiconductor device used in the fabrication process of a semiconductor device according to anther embodiment of the invention.

FIG. 10 is a view illustrating a semiconductor fabricating apparatus used in the process of fabricating a semiconductor device according to another embodiment of the invention.

A semiconductor fabricating apparatus 41 shown in FIG. 10 is a film-forming apparatus used in the process of forming a silicon-germanium film or a silicon film on a semiconductor substrate and is a single wafer processing CVD apparatus. For understanding in a simple way, the structure of the semiconductor fabricating apparatus 41 other than a processing chamber 42 and means or members provided in the inside thereof is not particularly shown with its detailed description being omitted.

The semiconductor fabricating apparatus 41 is provided with a processing chamber 42, a susceptor 43 arranged in the processing chamber 42, a susceptor support 44 for supporting the susceptor 43, a high frequency coil 46 disposed below the susceptor and accommodated in a coil cover 45, a gas nozzle 47 through which different types of gases are introduced into the processing chamber 42, and a gas exhaust port 48 for discharging a gas from the processing chamber.

The processing chamber is a hermetically sealable reaction chamber and has a base plate 49 and a bell jar 50 which is in hermetically sealable connection with the base plate 49 through an O ring. It will be noted that the bell jar 50 has substantially the same arrangement as the bell jar 10 of the first embodiment and is not shown and illustrated in detail herein.

The susceptor 43 is supported with the susceptor support 44 within the processing chamber 42 which is a kind of space surrounded by the base plate 49 and the bell jar 50. The susceptor 43 is so arranged that a semiconductor wafer (semiconductor substrate) 52 of a large diameter, e.g. a semiconductor wafer 52 whose diameter is 200 mm or over, can be placed on the susceptor 43. The susceptor 43 is made, for example, of carbon with its surface being coated, for example, with silicon carbide (SiC).

The high frequency coil 46 accommodated in the coil cover 5 is connected to a high frequency power supply, not shown, at outside of the processing chamber 42 so that a high frequency voltage or power can be applied or supplied to the high frequency coil 46 from the high frequency power supply. When high frequency power is supplied to the high frequency coil 46, an induction current generates in the susceptor 43 whose inside is made of carbon. In this way, the semiconductor wafer 52 placed on the susceptor 43 can be heated to a desired temperature.

A gas nozzle 47 is connected to a gas introducing means not shown, so that desired types of gases can be introduced from the gas nozzle 47 into the processing chamber 42 at a desired flow rate. A gas exhaust port 48 is connected to a gas exhaust pipe not shown, and the gases introduced from the gas nozzle 47 into the processing chamber 42 can be discharged.

The gas nozzle 47 is disposed at the upper portion of the processing chamber 42 and arranged in such a way that desired types of gases are introduced into the processing chamber 42 above the semiconductor wafer 52 arranged on the susceptor 43. The gas nozzle 47 is bifurcated to provide two tip portions. A plurality of holes (not shown) are formed at individual two tip portions of the gas nozzle 47, like the case of the tip portion of the gas nozzle 7 in Embodiment 1. Desired types of gases are charged or introduced into the processing gas 42 from individual holes. Like the gas nozzle 7, the gas nozzle 47 has the holes formed at different positions of the curved surface of the tip portion thereof. The gas nozzle may not have a bifurcated arrangement, but may be trifurcated or more. Moreover, the gas nozzle 47 may be so arranged as to be rotated in the processing chamber 42.

In the arrangement set out hereinabove, gases for film formation are released or radiated as being directed from the inside of the processing chamber 47 via the holes of the gas nozzle 47 toward the inner walls of the processing chamber 42. As will be seen from gas flows 53 schematically shown by arrows in FIG. 10, for example, the gas is emitted from the gas nozzle 47 in a horizontal direction (i.e. a direction parallel to the susceptor 43, or a direction parallel to the main surface of the semiconductor wafer 52), in an upper or vertical direction (i.e. a direction vertical to the susceptor 3, or a direction vertical to the main surface of the semiconductor wafer 12) and in arbitrary directions intermediate between the horizontal and vertical directions. The gas emitted from the holes of the gas nozzles 47 into the processing chamber is such that a turbulence eddy flow is caused within the processing chamber, like Embodiment 1, and eddy currents are generated in the gas flow above the semiconductor wafer. The eddy currents in the gas flow within the processing chamber 42 are not kept uniform but change irregularly. In this manner, the gas is forcedly circulated within the processing chamber, so that the silicon-germanium film or silicon film formed on the semiconductor wafer can be made uniform in the inplane of the semiconductor wafer 52 with respect to the quality and thickness thereof. Although the gas is emitted from the gas nozzle 47 in plural directions according to this embodiment, it may be emitted in one direction, e.g. in an upper or vertical direction alone.

The fabricating process of a semiconductor device using the semiconductor device fabricating apparatus 41 is similar to that of Embodiment 1 except that semiconductor wafers 52 are subjected to film formation of a silicon-germanium film by use of the semiconductor fabricating apparatus 41 one by one and is not repeatedly illustrated herein.

According to this embodiment, in case where a silicon-germanium film is formed on a semiconductor wafer 52 of large diameter (e.g. a diameter of 20 mm or over) by use of a single wafer processing, the film-forming rate of the silicon-germanium film can be improved, and uniform thickness and quality of the film are ensured. In addition, a semiconductor fabricating apparatus having a plurality of processing chambers may be arranged.

(Embodiment 3)

Figure 11:
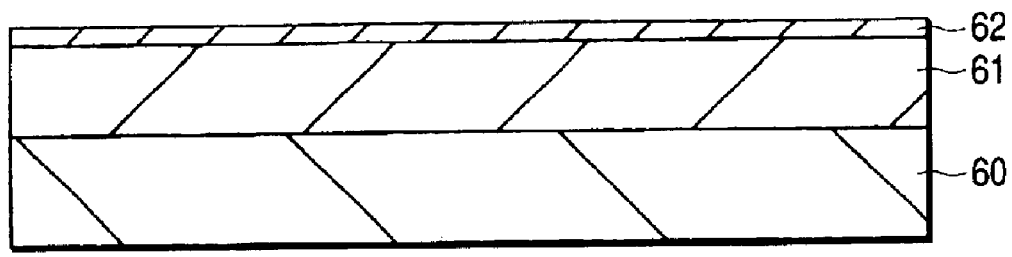
FIG. 11 is a sectional view conceptionally showing the state of forming a silicon film on a silicon-germanium film on a semiconductor wafer.

FIG. 11 is a sectional view conceptionally showing the state wherein a silicon-germanium film 61 and a silicon film (strained silicon film) 62 are, respectively, formed on a semiconductor wafer (semiconductor substrate) 60.

The lattice constant of silicon-germanium increases with an increasing concentration of germanium. Accordingly, where the silicon-germanium film 61 is formed on the semiconductor wafer 60 made of single crystal silicon, the epitaxial growth of a silicon-germanium film having a great concentration of germanium on the semiconductor wafer 60 incurs the possibility of causing inconveniences to occur in such a way that the silicon-germanium film is greatly strained owing the difference in lattice constant thereby causing defects of high density to be formed in the silicon-germanium film. To avoid this, the concentration of germanium in the silicon-germanium film 61 is made relatively small in the vicinity of the interface between the semiconductor wafer 60 and the silicon-germanium film 61, so that the lattice constant matching at the interface between the semiconductor wafer 60 and the silicon-germanium film 61 is likely to occur. As the formation of the silicon-germanium film 61 proceeds, the concentration of germanium increases, for example, in a stepwise manner so that stress is gradually applied thereto. Upon arrival at a predetermined concentration of germanium, the silicon-germanium film 61 is so formed that the concentration of germanium is kept constant (forward step graded process). This enables one to suppress the occurrence of defects concentrated in the vicinity of the interface between the semiconductor wafer 60 and the silicon-germanium film 61 and to reduce a through dislocation density in the silicon-germanium film 61. On the other hand, in case where the silicon film (strained silicon film) 62 is epitaxially grown on the silicon-germanium film 61, the silicon film 62 formed on the underlying silicon-germanium film is strained (i.e. the film is expanded over the lattice constant of ordinary silicon) depending on the lattice constant of the underlying silicon-germanium film 61. In this connection, the strained silicon film 62 is relatively thin (e.g. 40 to 50 nm), so that few dislocations occur in the strained silicon film 62.

According to the study made by us, however, when the concentration of germanium along the thickness of the silicon-germanium film 61 as set forth hereinabove is gradually increased from the interface between the semiconductor wafer 60 and the silicon-germanium film 61 toward the direction of inside of the silicon-germanium film 61, stress in the silicon-germanium film 61 is applied to the same direction. As a result, it has been found that various drawbacks ascribed to the accumulated stress, e.g. an increase in number of defects in the silicon-germanium film 61, and an increase in surface roughness of the silicon-germanium film 61 and the strained silicon film 62, are caused to occur.

In this embodiment, studies have been made to overcome these drawbacks ascribed to the increase in the concentration of germanium along the thickness of the silicon-germanium film 61 from the interface between the semiconductor wafer 60 and the silicon-germanium film 61 toward the inward direction of the silicon-germanium film 61.

The fabricating method of a semiconductor device according to this embodiment, i.e. a process of forming a silicon-germanium film and a silicon film (strained silicon film) on a semiconductor substrate, is illustrated.

Figure 12:
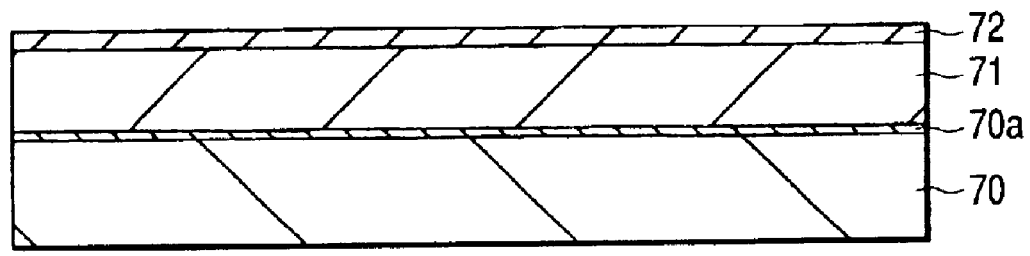
FIG. 12 is a sectional view of an essential part in the course of the fabrication of a semiconductor device according to a further embodiment of the invention.
Figure 13:
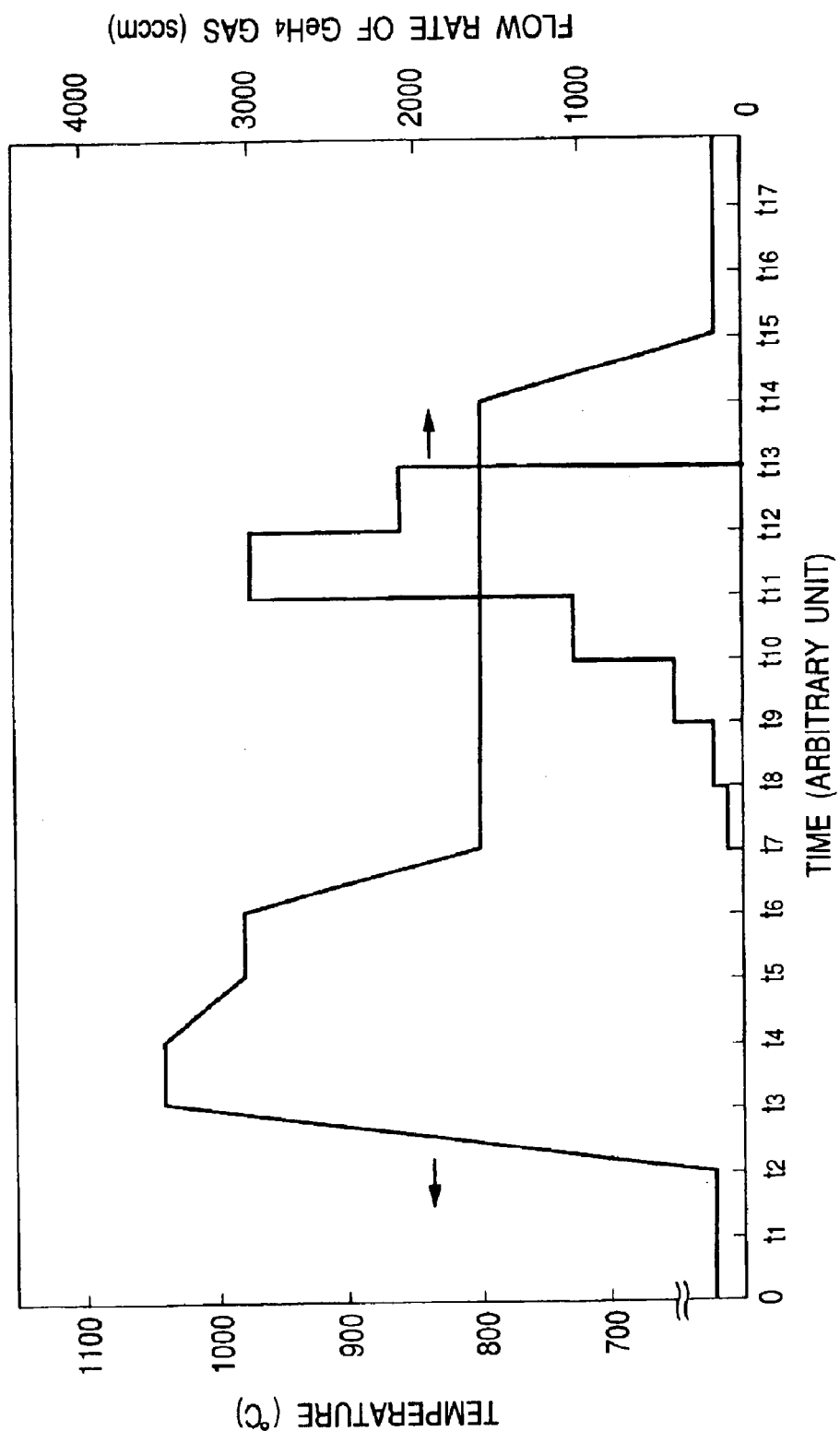
FIG. 13 is a graph showing the temperature of a semiconductor wafer in the steps of forming a silicon-germanium film and a strained silicon film and the flow rate of a monogermane ($GeH_4$) gas introduced into a film-forming apparatus.

FIG. 12 is a sectional view of an essential part in the course of fabrication of a semiconductor device according to the embodiment wherein a silicon-germanium film (SiGe film) 71 and a silicon film (strained silicon film) 72 are formed on a semiconductor wafer (semiconductor substrate) 70. FIG. 13 is a graph showing the variations in the temperature of the semiconductor wafer 70 in the formation process of the silicon-germanium film 71 and the silicon film 72 and also in the flow rate of a monogermane ($GeH_4$) gas introduced into a film-forming apparatus. In the graph of FIG. 13, the ordinates indicate the temperature of the semiconductor wafer and the flow rate of the monogermane ($GeH_4$) gas, respectively. The abscissa in the graph of FIG. 13 indicates time, in which attention should be paid to the fact that the time is expressed in terms of an arbitrary unit and the respective time intervals of times $t_1$ to $t_{17}$ are not set constantly.

Initially, the semiconductor wafer (semiconductor substrate) 70 is transferred to a film-forming apparatus. In this case, it is preferred that such a semiconductor fabricating apparatus 1 or 41 as used hereinbefore is provided as the film-forming apparatus and a silicon-germanium film and a silicon film (strained silicon film) are epitaxially grown in a pressure within a range of atmospheric and quasi-atmospheric regions. This is because the silicon-germanium film and strained silicon film can be, respectively, formed on a plurality of semiconductor wafers within a short time, or the film-forming rate can be improved. As a matter of course, other type of film-forming apparatus such as a low pressure CVD apparatus or a UHV-CVD method may be used so that a silicon-germanium film and a strained silicon film can be epitaxially grown on the semiconductor wafer 70 under vacuum. The case using the semiconductor fabricating apparatus 1 is illustrated herein.

For the semiconductor wafer 70, a 4 degrees off (100) plane substrate made, for example, of silicon single crystal, i.e. a single crystal silicon substrate having a main surface inclined by 4 degrees from the (100) plane of silicon can be used.

Nitrogen ($N_2$) gas is introduced into a processing chamber 2 of the semiconductor fabricating apparatus 1, in which the semiconductor wafers 70 are arranged in position at a flow rate, for example, of 150 slm (standard liters per minute) to well purge air from the processing chamber. In doing so, the reaction between air and hydrogen gas introduced hereinafter can be prevented. It will be noted that the gas flow rate used herein means a gas flow rate calibrated in terms of 0° C. and 1 atmospheric pressure.

Subsequently, the introduction of nitrogen gas is stopped at time of $t_1$, and hydrogen ($H_2$) gas serving as a carrier gas is introduced into the processing chamber 2 at a flow rate, for example, of 170 slm. It will be noted that the introducing of hydrogen gas is continued up to time of $t_{17}$.

After removal of the nitrogen gas from the processing chamber 2, application or supply of high frequency power to the high frequency coil 6 of the semiconductor fabricating apparatus 1 commences at time of $t_2$. This permits the susceptor 3 to be heated by application of an induction current thereto, thereby increasing the temperature of the semiconductor wafer 70. The semiconductor wafer 70 is heated at 1040° C., for example, for about 10 minutes (corresponding to a period of $t_3$ to $t_4$). The heating (preheating process) of the semiconductor wafer 70 in a reductive atmosphere, such as an atmosphere of hydrogen, permits a native oxide film on the surface of the semiconductor wafer 70 to be removed, thereby cleaning or cleansing the surface of the semiconductor wafer.

Next, the temperature of the semiconductor wafer 70 is lowered, for example, to 980° C. over a period of $t_4$ to $t_5$. Thereafter, a monosilane ($SiH_4$) gas is further introduced, aside from the hydrogen gas, into the processing chamber 2 over a period of $t_5$ to $t_6$ (for example, about one minute), for example, at a flow rate of 40 sccm (standard cubic centimeters per minute). Thus, an about several nanometers thick silicon film 70a is formed on the semiconductor wafer 70 thereby obtaining a cleaner silicon surface. Thereafter, the introduction of the monosilane gas is stopped at time of $5_6$, followed by lowering the temperature of the semiconductor wafer 70, for example, to 800° C.

Next, at time of $t_7$, a monosilane ($SiH_4$) gas serving as a silicon source gas, a diborane ($B_2H_6$) gas serving as a P-type doping gas and a monogermane ($GeH_4$) gas serving as a germanium source gas are introduced, aside from the hydrogen gas serving as a carrier gas, into the processing chamber 2 at flow rates, for example, of 20 sccm, 60 sccm and 80 sccm, respectively. Upon the introduction, although the epitaxial growth of a silicon-germanium film 71 commences, the flow rate of the germane gas is relative low, so that the silicon-germanium film 71 formed at this stage has a relatively low concentration of germanium. It will be noted that the monosilane ($SiH_4$) gas and the diborane ($B_2H_6$) gas are continuedly introduced up to time of $t_{14}$ so that the respective flow rates are kept constant, for example.

Subsequently, the flow rate of the monogermane gas introduced into the processing chamber 2 is increased, for example, to 170 sccm at time of $t_8$. This permits the resulting silicon-germanium film 71 to become slightly higher in concentration of germanium therein.

Thereafter, the flow rates of the monogermane gas introduced into the processing chamber at times of $t_9$, $t_{10}$ and $t_{11}$ are sequentially increased, for example, to 420 sccm, 1050 sccm and 3000 sccm. At the stages corresponding to the respective flow rates, the concentration of germanium in the silicon-germanium film 71 increase correspondingly to the increase in flow rate of the monogermane gas.

Thereafter, the flow rate of the monogermane gas introduced into the processing chamber 22 is lower, for example, to 2100 sccm at time of $t_{12}$. Eventually, the concentration of germanium in the silicon-germanium film 71 formed over a period of $t_{12}$ to $t_{13}$ (at which the flow rate of the monogermane gas is at 2100 sccm) becomes lower than that in the silicon germanium film 71 formed over a period of $t_{11}$ to $t_{12}$ (at which the flow rate of the monogermane gas is at 3000 sccm).

Next, the introduction of the monogermane gas into the processing chamber at time of $t_{13}$ is stopped (although the introduction of the monosilane gas and the diborane gas is continued). By the stop, the epitaxial growth of the silicon-germanium film is completed, and a silicon film (strained silicon film) 72 is epitaxially grown on the silicon-germanium film 71. The thickness of the silicon-germanium film 71 formed over a period of $t_1$ to $t_{13}$ is, for example, at about 3 to 4 μm. Likewise, the thickness of the strained silicon film 72 formed on the silicon-germanium film 71 at a period of $t_{13}$ to $t_{14}$ is, for example, at about 40 to 50 nm.

Thereafter, the introduction of the monosilane gas and the diborane gas into the processing chamber 2 is stopped at time of $t_{14}$ to complete the formation of the strained silicon film 72. Moreover, the supply of the high frequency power to the high frequency coil 6 is also stopped to lower the temperature of the semiconductor wafer 70, for example, to room temperature or thereabouts. Subsequently, the introduction of the hydrogen gas into the processing chamber 2 is stopped at time of $t_{16}$ and nitrogen gas is introduced instead. After the hydrogen gas has been well removed from the processing gas 2, the semiconductor wafer 70 is removed from the semiconductor fabricating apparatus 1. FIG. 12 shows the state where the silicon-germanium film 71 and the silicon film (strained silicon film) 72 are formed on the semiconductor wafer 70 in this manner. The thus removed semiconductor wafer 70 is fed to a next fabrication step to form a semiconductor element in the semiconductor wafer 70.

The subsequent fabrication steps of the semiconductor device are similar to those of Embodiment 1 and are not described herein.

It will be noted that although, in this embodiment, the flow rate of the monogermane gas is increased or decreased in a stepwise manner over the period of $t_7$ to $t_{12}$ as is particularly shown in the graph of FIG. 13, the flow rate of the monogermane gas may be continuously increased or decreased over the period of $t_7$ to $t_{12}$.

Figure 15:
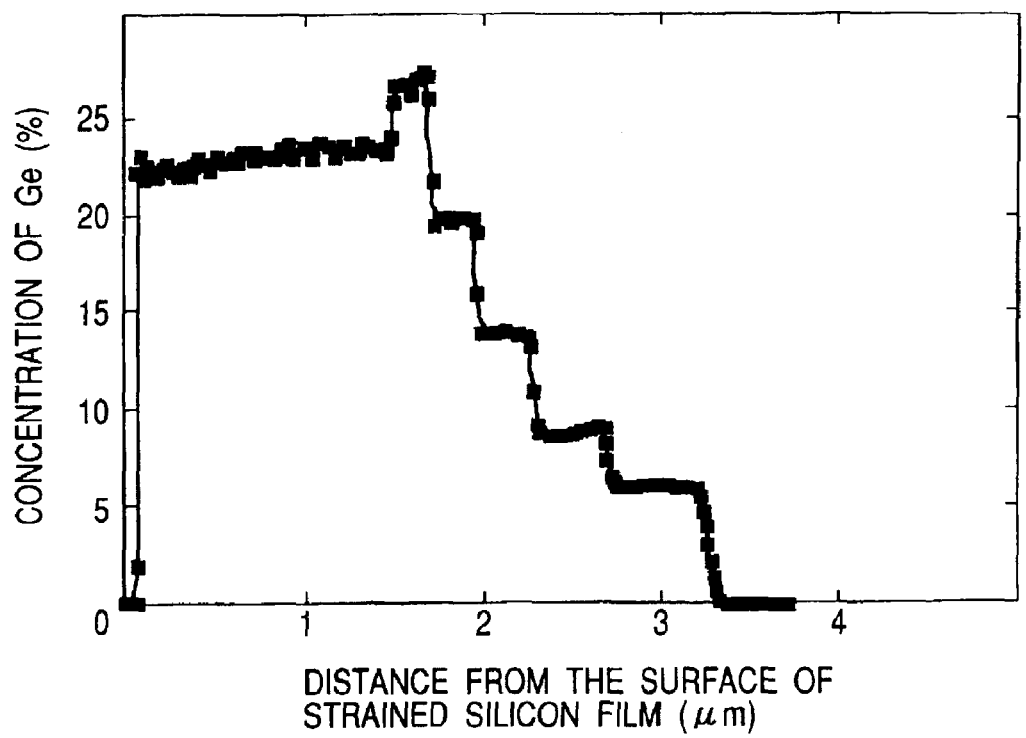
FIG. 15 is a graph showing a distribution of germanium concentration along a depth of a silicon-germanium film.

FIG. 15 is a graph showing a distribution of germanium concentration along the thickness of the silicon-germanium film 71 formed according to this embodiment, and the results (found values) obtained by analysis through a SIMS (secondary ion mass spectroscopy) are shown. In FIG. 15, the abscissa indicates a distance (depth) along the depth from the surface of the strained silicon film, and the ordinate indicates a concentration of germanium (i.e. Ge concentration).

As will be seen from FIG. 15, although the concentration of germanium along the thickness of the silicon-germanium film 71 increases in a stepwise manner from the interface (i.e. an interface between the silicon-germanium film 71 and the semiconductor wafer 70 or the silicon film 70a) at the side of the semiconductor wafer (semiconductor substrate) 70 of the silicon-germanium film 71 toward the inward direction of the silicon-germanium film 71, a maximum value or a peak appears at an intermediate region with respect to the thickness of the silicon-germanium film 71, after which the concentration decreases. The germanium concentration in the silicon-germanium film 71 depends on the flow rate of a germanium source gas used in the film-forming step, particularly, a monogermane gas ($GeH_4$) herein. The reason why the concentration of germanium increases in a stepwise manner from the interface at the semiconductor wafer 70 side of the silicon-germanium film 71 toward the inner direction of the silicon-germanium film 71 (this concentration-increasing region and neighborhood thereof is referred to as forward step graded region) is that during the film-forming procedure of the silicon-germanium film 71, the flow rate of the monogermane gas is sequentially increased in a stepwise manner in the order of 80 sccm, 170 sccm, 420 sccm, 1050 sccm and 3000 sccm. Accordingly, the region of the silicon-germanium film 71 where the concentration of germanium becomes maximal or a peak corresponds to a film-forming stage (time period of $t_{11}$ to $t_{12}$) where the flow rate of the monogermane gas in the course of the film-forming step of the silicon-germanium film 71 is maximized (at 3000 sccm). The reason why the concentration decreases in a stepwise manner toward the interface (i.e. the interface between the silicon-germanium film 71 and the strained silicon film 72) at the strained silicon film 72 side of the silicon-germanium film 71 after the establishment of a peak concentration of germanium in the silicon-germanium film 71 (this concentration decreasing region and the neighborhood thereof are refereed to as reverse step graded region) is that the flow rate of the monogermane gas is lowered from 3000 sccm to 2100 sccm in the film-forming step of the silicon-germanium film 71. After the flow rate of the monogermane gas is maintained at 2100 sccm over the time period of $t_{12}$ to $t_{13}$, the introduction of the monogermane is stopped. Accordingly, the concentration of germanium in the silicon-germanium film 71 once decreases from the peak in the reverse step graded region, after which the concentration is kept substantially constant in the vicinity of the interface between the silicon-germanium film 71 and the strained silicon film 72. It is to be noted that in FIG. 15, the region where the concentration of germanium rapidly decreases in a region of the strained silicon film 72 defined at a distance of several tens of nanometers from the surface thereof corresponds to a strained silicon film 72-forming region.

Figure 14:
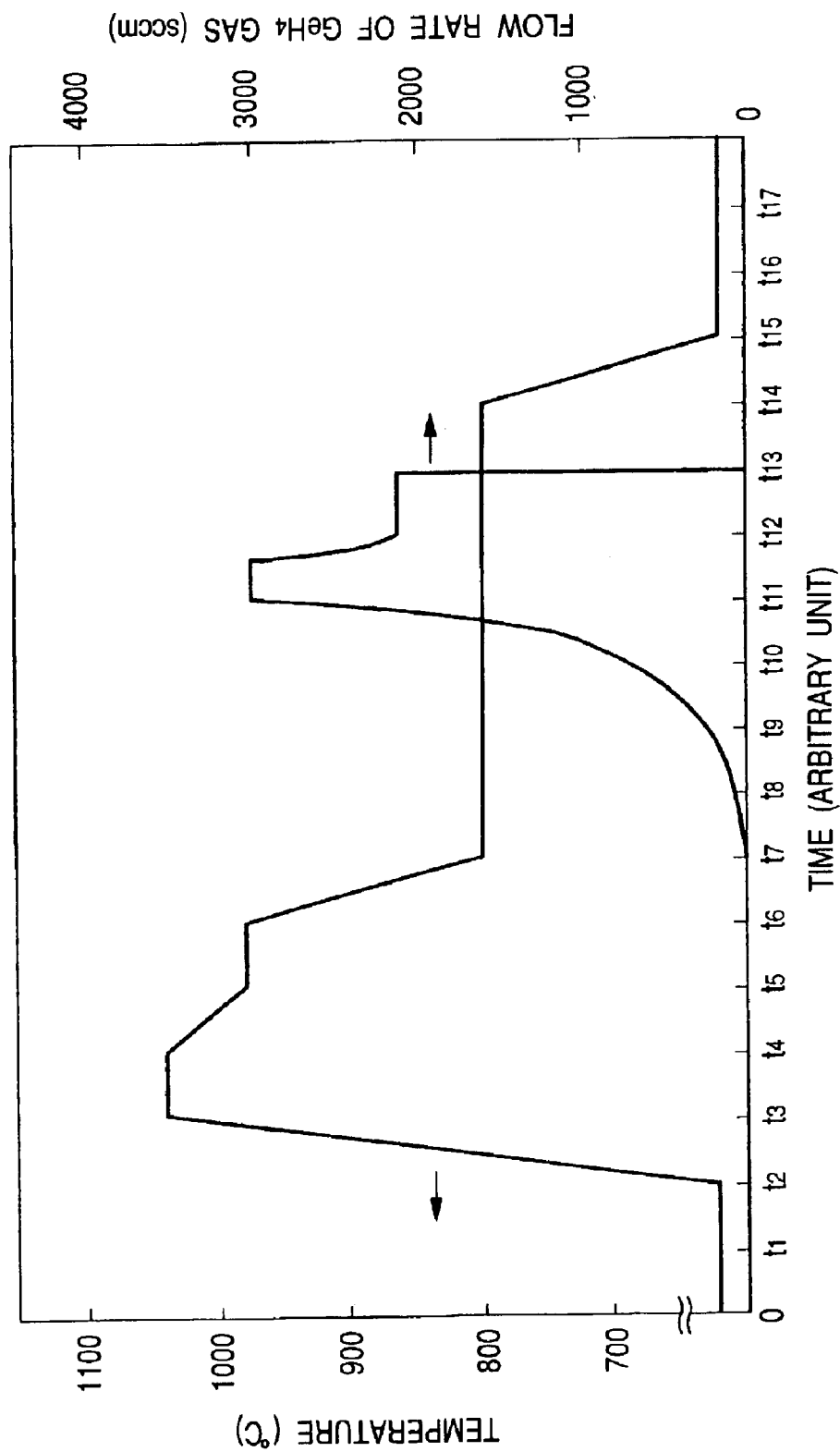
FIG. 14 is a graph showing the temperature of a semiconductor wafer in the steps of forming a silicon-germanium film and a strained silicon film and the flow rate of a monogermane ($GeH_4$) gas introduced into a film-forming apparatus.
Figure 16:
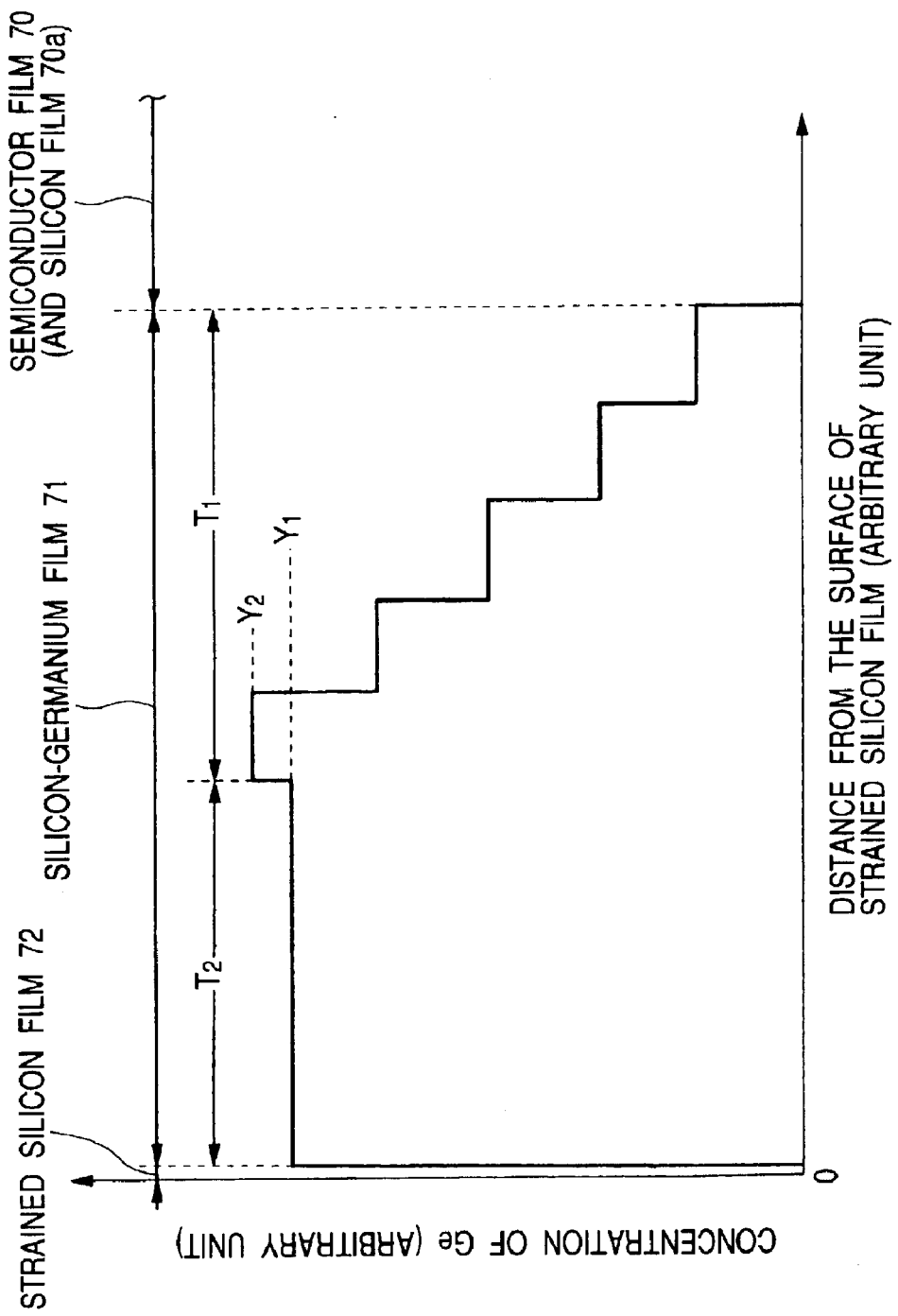
FIG. 16 is a graph schematically showing a distribution of germanium concentration along a depth of a silicon-germanium film.
Figure 17:
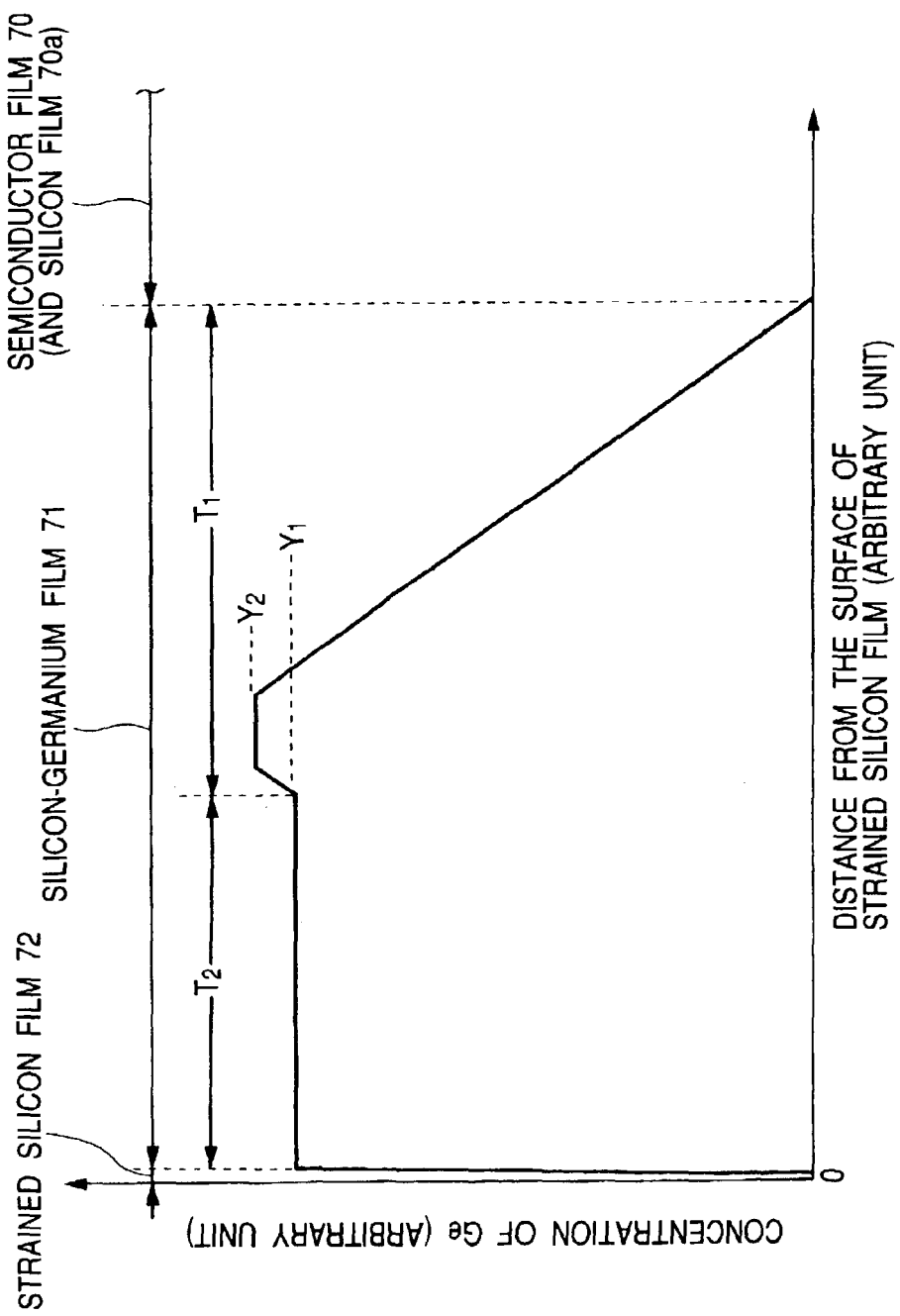
FIG. 17 is a graph schematically showing a distribution of germanium concentration along a depth of a silicon-germanium film.

FIG. 16 is a graph schematically showing the distribution of germanium concentration along the thickness of the silicon-germanium film 71 in case where the silicon-germanium film is formed according to this embodiment and corresponds to FIG. 15. FIG. 17 is a graph schematically showing the distribution of germanium concentration along the thickness of the silicon-germanium film 71 in case where the silicon-germanium film 71 is formed while continuously increasing or decreasing the flow rate of the monogermane gas as in FIG. 14. The abscissa in FIGS. 16 and 17 indicates a distance (depth) from the surface of the strained silicon film 72 along the depth thereof. The ordinate in FIGS. 16 and 17 indicates a concentration of germanium (Ge concentration).

The germanium concentration $Y_1$ in the silicon-germanium film 71 in the vicinity of the interface between the silicon-germanium film 71 and the strained silicon film 72 preferably ranges from 5 to 40% (atomic %), more preferably from 10 to 30% (atomic %) and most preferably from 15 to 25% (atomic %). In doing so, the strained silicon film 72 can be appropriately formed on the silicon-germanium film 71 as having an optimum lattice constant ensuring an improved mobility of electron, thereby making it possible to fabricate a high-speed semiconductor device.

The difference between the peak value $Y_2$ of the germanium concentration in the silicon-germanium film 71 and the germanium concentration $Y_1$, i.e. $Y_2-Y_1$, should preferably be in the range of from 1 to 40% (atomic %), more preferably from 3 to 20% (atomic %) and most preferably from 5 to 10% (atomic %). The ratio of the peak value $Y_2$ of the germanium concentration in the silicon-germanium film 71 to the germanium concentration $Y_1$, i.e. $Y_2/Y_1$, should preferably be in the range of from 1.02 to 9.0, more preferably from 1.1 to 3.0 and most preferably from 1.2 to 1.7. As will be described hereinafter, this permits the strain or stress in the silicon-germanium film 71 to be mitigated, thereby forming the silicon-germanium film 71 and the strained silicon film 72 wherein crystal defects are suppressed from occurring. Thus, a semiconductor device having high reliability and high performance can be realized.

A thickness $T_1$ of the region where the concentration of germanium is changed, or is decreased or increased is, for example, in the range of about 1.5 to 2 μm. A thickness $T_2$ of the region where the concentration of germanium in the silicon-germanium film 71 is uniform is, for example, in the range of about 1.5 to 2 μm. The intervals of the steps where the concentration of germanium is changed in a stepwise manner are, for example, in the range of about 0.3 to 0.5 μm.

Next, in order to evaluate the crystal defects in the silicon-germanium film 71, a maximum through dislocation density of the silicon-germanium film 71 was measured. The maximum through dislocation density was determined by selectively etching the semiconductor wafer (semiconductor substrate) 70 forming the silicon-germanium film 71 and the strained silicon film 72 thereon and observing the surface via a metallurgical microscope. As a consequence, the maximum through dislocation density of the silicon-germanium film 71 formed according to the embodiment was found to be at about $1 \times 10^4$ cm$^{-2}$.

For comparison, a silicon-germanium film was formed by increasing the concentration of germanium from an initial stage of formation of the silicon-germanium film in a stepwise manner, and keeping a constant concentration of germanium without reduction in concentration after the concentration of germanium arrived at a maximum value (i.e. with the case of the silicon-germanium film 61), followed by measurement of a maximum through dislocation density. In this comparative example, the maximum through dislocation density was found to be at about $1 \times 10^6$ cm$^{-2}$.

Accordingly, the maximum through dislocation density can be made small according to the embodiment of the invention wherein the concentration of germanium is increased in a stepwise manner from an initial stage of forming the silicon-germanium film and the silicon-germanium film 71 is formed by once reducing the concentration of germanium after arrival of the concentration of germanium at a maximum value. This enables one to reduce the defect density in the silicon-germanium film 71 and the strained silicon film 72 formed thereof. This leads to an improvement in reliability of the resulting semiconductor device.

As set out hereinabove, when the concentration of germanium along the thickness of silicon-germanium film 71 is gradually increased from the interface at the semiconductor wafer (semiconductor substrate) 70 side toward the inner direction of the silicon-germanium film 71, the stress in the silicon-germanium film 71 is applied in the same direction and thus, is accumulated. When the concentration of germanium is lowered after the concentration arrives at a peak, the stress accumulated in the forward step graded region can be mitigated in the vicinity of the reverse step graded region. This enables the defects of the silicon-germanium film 71 to be reduced in number in the vicinity of the interface between the silicon-germanium film 71 and the strained silicon film 72. In this way, the strained silicon film 72 can be epitaxially grown on the underlying silicon-germanium film 71 having a reduced number of defects. Thus, the defects in the strained silicon film 72 can be suppressed from occurring. It will be noted that such an effect as set forth hereinabove may be likewise obtained in the case where after the concentration of germanium in the silicon-germanium film 71 reaches a peak, the concentration of germanium is reduced in a stepwise manner in the direction of the interface between the silicon-germanium film 71 and the strained silicon film 72 (corresponding to the case of the distribution of germanium concentration in FIG. 16) or the concentration is continuously reduced (corresponding to the case of the distribution of germanium concentration in FIG. 17).

Next, the surface roughness of the semiconductor wafer (semiconductor substrate) 70 forming the silicon-germanium film 71 thereon according this embodiment was measured. To this end, the silicon-germanium film 71 and the strained silicon film 72 were formed on the semiconductor wafer 70, respectively, followed by measurement of the roughness of the surface (i.e. the surface of the strained silicon film) according to AFM (atomic force microscopy) to calculate a RMS (root mean square) value of the surface roughness. The surface roughness of the thin strained silicon film 72 depends on the surface roughness of the underlying silicon-germanium film 71.

Where the silicon-germanium film 71 was formed according to this embodiment and the film-forming temperature for the silicon-germanium film 71 was at 777° C., the RMS value of the surface roughness was found to be at 3.6 nm. When the film-forming temperature for the silicon-germanium film 71 was at 800° C., the RMS value of the surface roughness was found to be at 2.5 nm.

For comparison, the RMS value of the surface roughness was measured with respect to the case wherein the silicon-germanium film was formed in such a way that the concentration of germanium was increased in a stepwise manner from an initial state of formation of the silicon-germanium film and after the concentration of germanium reached a maximum value, the concentration of germanium was kept constant without reduction in the concentration (i.e. the case of the silicon-germanium film 61). In this case, the film-forming temperature of the silicon-germanium film 61 was at 777° C. In this comparative example, the RMS value of the surface roughness was found to be at 4.1 nm.

As will be apparent from the foregoing, the surface roughness can be made small by forming the silicon-germanium film 71 in such a way that the concentration of germanium is increased in a stepwise manner from an initial stage of forming the silicon-germanium film and after the concentration of germanium reaches a maximum value, the concentration of germanium is once reduced. In this way, the surface roughnesses of the silicon-germanium film 71 and the strained silicon film 72 formed thereon can be made small, respectively, thereby ensuring an improvement in reliability of the semiconductor device. In addition, the fabrication yield of the semiconductor device can also be improved. When the film-forming temperature of the silicon-germanium film 71 is raised, the surface roughness can be made smaller. Such an effect as set forth hereinabove may be likewise obtained in the case where after the concentration of germanium in the silicon-germanium film 71 reaches a peak, the concentration of germanium is reduced in a stepwise manner in the direction of the interface between the silicon-germanium film 71 and the strained silicon film 72 (corresponding to the case of the distribution of germanium concentration in FIG. 16) or the concentration is continuously reduced (corresponding to the case of the distribution of germanium concentration in FIG. 17).

Figure 18:
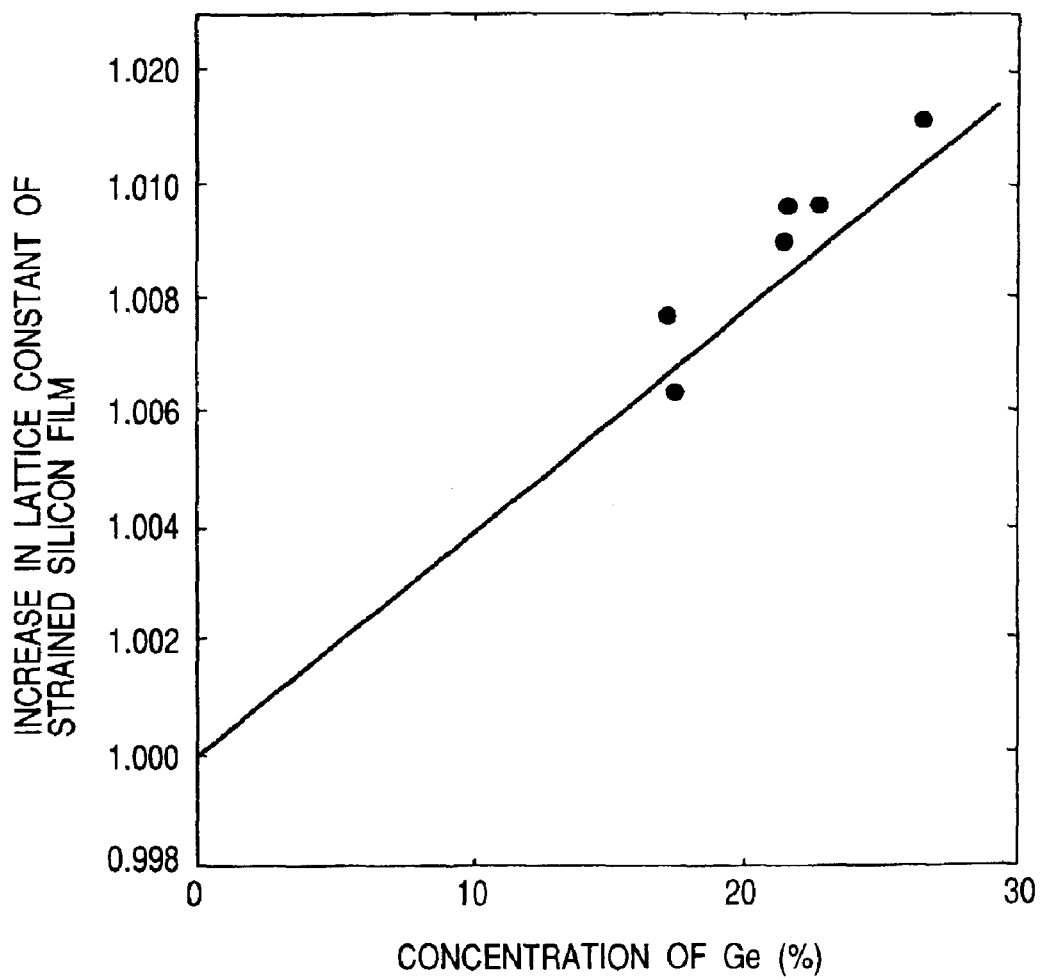
FIG. 18 is a graph showing the results of measuring of an increase in lattice constant of the strained silicon film formed on the silicon-germanium film.

FIG. 18 is a graph showing the results of measurement of an increase in lattice constant of the strained silicon film 72 formed on the silicon-germanium film 71 formed according to this embodiment. The abscissa of the graph of FIG. 18 indicates a concentration of germanium (i.e. $Y_1$ in the graphs of FIGS. 16 and 17) in the silicon-germanium film 71 in the vicinity of the interface between the silicon-germanium film 71 and the strained silicon film 72. The ordinate of the graph of FIG. 18 indicates an increase in lattice constant of the strained silicon film 7 along xy direction (i.e. the inplane direction parallel to the main surface of the semiconductor wafer 70) as a relative value in case where the lattice constant an ordinary silicon single crystal is taken as 1. The solid circle in the graph of FIG. 18 corresponds to a found value of lattice constant of the strained silicon film 72, and the straight line in the graph indicates the theoretical value (upon mitigation of a cubic strain) showing the relation between the lattice constant of silicon-germanium and the concentration of germanium.

As will be seen from the graph of FIG. 18, the found value of lattice constant of the strained silicon film 72 is substantially in coincidence with the theoretical line showing the relation between the lattice constant of silicon-germanium and the concentration of germanium. More particularly, the strained silicon film 72 has an increased (or strained) lattice constant correspondingly to the lattice constant of the underlying silicon-germanium film 71. Thus, it can be confirmed that the strained silicon film 72 formed according to the embodiment has a strain corresponding to the concentration of germanium ($Y_1$) in the underlying silicon-germanium film 71 and thus, the silicon-germanium film 71 is satisfactorily mitigated with respect to the strain thereof.

Next, the processing procedure of the semiconductor wafer (semiconductor substrate) 70 prior to the formation of the silicon-germanium film 71 is described. It is preferred that after the following process, the silicon-germanium film 71 is epitaxially grown on the semiconductor wafer 70. The following processing procedures can also be used as a processing procedure of the semiconductor wafer (semiconductor substrate) 12 prior to the formation of the silicon-germanium film 21 in Embodiment 1 wherein it is as a matter of course that the silicon-germanium film 21 should preferably be epitaxially grown on the semiconductor wafer 12 after the processing thereof.

For instance, the semiconductor wafer 70 is heated, for example, to 1040° C. (pre-heating treatment) in a reductive atmosphere such as of hydrogen gas to remove a native oxide film from the surface of the semiconductor wafer 70, thereby cleaning the surface of the semiconductor wafer 70. This enables one to epitaxially grow the silicon-germanium film 71 on the cleaned surface of the semiconductor wafer 70.

Alternatively, after the removal of the native oxide film through the heating treatment, a monosilane gas ($SiH_4$) may be introduced into the processing chamber 2 and the semiconductor wafer 70 is heated, for example, at 980° C. so that a thin silicon film 70a is epitaxially grown on the semiconductor wafer 70, thereby ensuring the formation of a clean silicon surface. In the embodiment illustrated with reference to FIG. 13, this treatment is carried out.

Still alternatively, a hydrogen chloride (HCl) gas may be introduced into the processing chamber 2 and the semiconductor wafer 70 is heated, for example, at 900° C. to etch the surface of the semiconductor wafer 70, thereby removing the native oxide film from the surface of the semiconductor wafer 70. This step is especially effective in the case where the temperature of the semiconductor wafer 70 is suppressed to a level of 1000° C. or below.

Yet still alternatively, after such a pre-heating treatment for cleaning the surface of the semiconductor wafer 70 as mentioned above, a hydrogen chloride gas may be introduced into the processing chamber 2 as set out above to etch the surface of the semiconductor wafer 70.

Still alternatively, after such a pre-heating treatment for cleaning the surface of the semiconductor wafer 70 as mentioned above, a hydrogen chloride gas may be introduced into the processing chamber 2 to etch the surface of the semiconductor wafer 70, followed by epitaxial growth of the thin silicon film 70a on the semiconductor wafer 70 as set out hereinabove.

Although these surface processing procedures have been described with respect to the formation of the silicon-germanium film 71 on the semiconductor wafer 70, these procedures are also effective as a surface processing procedure upon further formation of a silicon-germanium film or a silicon film on the silicon-germanium film 71 which has been formed on the semiconductor wafer 70. Moreover, these procedures are also effective as a surface processing procedure upon further formation of a silicon-germanium film or a silicon film after polishing the surface of the silicon-germanium film 71, for example, by CMP (chemical mechanical polishing).

Although a monosilane ($SiH_4$) gas is used as a silicon source gas in the above embodiment, a $SiH_2Cl_2$ gas may be used as a silicon source gas in place of the $SiH_4$ gas. This makes it possible to improve the growing rates of the silicon-germanium film 71 and the strained silicon film 72 or suppress the occurrence of foreign matters.

Moreover, a $SiGH_2Cl_2$ gas may be initially used as a silicon source gas and replaced by a monosilane ($SiH_4$) gas for use as a silicon source gas at a final stage of forming the silicon-germanium film 71 (for example, over final several minutes during a period of $t_{12}$ to $t_{13}$ in the graph of FIG. 13) and also at a film-forming stage (over a period of $t_{13}$ to $t_{14}$) of the strained silicon film 72. This permits the resulting film to become more flattened on the surface thereof. In addition, the use of a monosilane gas only for the formation of the strained silicon film 72 is also effective.

The invention is particularly described based on the embodiments and should not be construed as limiting the invention to these embodiments. Many alterations or changes without departing from the spirit of the invention may be possible.

In the embodiments of the invention, semiconductor devices having MISFET have been described, to which the invention is not limited. The invention may be applied to a fabricating method of various types of semiconductor devices having a silicon-germanium film formed therein and also to such semiconductor devices. For instance, a SiGe film can be selectively formed as a base portion of a bipolar element.

The effects obtained by typical embodiments of the invention are briefly described below.

The film-forming rate of the silicon-germanium film can be increased by forming a silicon-germanium film under a pressure within an atmospheric pressure and quasi-atmospheric pressure region.

The fabricating time of a semiconductor device can be shortened by forming the silicon-germanium film by use of a batch-type film-forming apparatus.

The silicon-germanium film can be made uniform with respect to the quality and thickness thereof by forming the silicon-germanium film while causing a turbulence of gases for film formation introduced into a processing chamber of a film-forming apparatus.

The defects in the silicon-germanium film can be reduced in number and the film surface can be more flattened by controlling a distribution of germanium concentration along the thickness of the silicon-germanium film epitaxially grown on a semiconductor substrate to have a peak in an intermediate region along the thickness of the silicon-germanium film.

What is claimed is:

1. A fabrication method of a semiconductor device, comprising the steps of:
   (a) placing a plurality of semiconductor wafers over a horizontal susceptor in a processing chamber of a batch-type film-forming apparatus; and
   (b) introducing gases for film formation into said processing chamber so that turbulence of said gases is caused above said semiconductor wafers within said processing chamber, thereby permitting a silicon-germanium film to be epitaxially grown over said semiconductor wafers respectively wherein said gases for film formation are introduced into said processing chamber through openings oriented in a plurality of directions including substantially horizontally, substantially vertically, and oblique directions there between, such that said turbulence of said gases is produced.

2. The method according to claim 1, wherein in step (b), said processing chamber is under a pressure within an atmospheric or quasi-atmospheric pressure region.

3. The method according to claim 2, wherein in step (b), said gases in said processing chamber are radiated from a center of said processing chamber toward a plurality of directions against inner walls of said processing chamber.

4. The method according to claim 1, further comprising a step of epitaxially growing a silicon film over said silicon-germanium film.

5. The method according to claim 1, further comprising, prior to step (b), a step of forming a silicon film over said semiconductor wafers,
   wherein, in step (b), said silicon-germanium film is formed over said silicon film formed over said semiconductor wafers.

6. The method according to claim 1, further comprising, prior to step (b), a step of heating said semiconductor wafers substrate in a reductive atmosphere.

7. The method according to claim 1, further comprising, prior to step (b), a step of etching said semiconductor wafers with a hydrochloride gas.

* * * * *